United States Patent
Brewer

(10) Patent No.: US 12,266,647 B2
(45) Date of Patent: *Apr. 1, 2025

(54) 3D STACKED INTEGRATED CIRCUITS HAVING FUNCTIONAL BLOCKS CONFIGURED TO PROVIDE REDUNDANCY SITES

(71) Applicant: Micron Technology, Inc., Boise, ID (US)

(72) Inventor: Tony M. Brewer, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/964,332

(22) Filed: Oct. 12, 2022

(65) Prior Publication Data

US 2023/0033072 A1    Feb. 2, 2023

Related U.S. Application Data

(63) Continuation of application No. 17/219,202, filed on Mar. 31, 2021, now Pat. No. 11,488,945, which is a (Continued)

(51) Int. Cl.
*H01L 25/18* (2023.01)
*G11C 29/00* (2006.01)
(Continued)

(52) U.S. Cl.
CPC .............. *H01L 25/18* (2013.01); *G11C 29/74* (2013.01); *H01L 23/481* (2013.01);
(Continued)

(58) Field of Classification Search
CPC .............. H01L 27/0688; H01L 27/118; H01L 25/0657; H01L 25/18; H01L 23/481;
(Continued)

(56) References Cited

U.S. PATENT DOCUMENTS 9,123,552 B2    9/2015    Keeth et al.
10,152,262 B2    12/2018    Qawami et al.
(Continued)

OTHER PUBLICATIONS

International Search Report and Written Opinion, PCT/US2019/056810, mailed Feb. 5, 2020.

*Primary Examiner* — Monica D Harrison
(74) *Attorney, Agent, or Firm* — Greenberg Traurig

(57) ABSTRACT

A three-dimensional stacked integrated circuit (3D SIC) that can have at least a first 3D XPoint (3DXP) die and, in some examples, can have at least a second 3DXP die too. In such examples, the first 3DXP die and the second 3DXP die can be stacked. The 3D SIC can be partitioned into a plurality of columns that are perpendicular to each of the stacked dies. In such examples, when a first column of the plurality of columns is determined as failing, data stored in the first column can be replicated to a second column of the plurality of columns. Also, for example, when a part of a first column of the plurality of columns is determined as failing, data stored in the part of the first column can be replicated to a corresponding part of a second column of the plurality of columns.

20 Claims, 15 Drawing Sheets

Related U.S. Application Data continuation of application No. 16/909,873, filed on Jun. 23, 2020, now Pat. No. 10,991,684, which is a continuation of application No. 16/218,901, filed on Dec. 13, 2018, now Pat. No. 10,707,197.

(51) Int. Cl.

| | |
|---|---|
| *H01L 23/48* | (2006.01) |
| *H01L 23/522* | (2006.01) |
| *H01L 25/065* | (2023.01) |
| *H01L 27/06* | (2006.01) |
| *H01L 27/118* | (2006.01) |
| *G06F 11/16* | (2006.01) |
| *G06F 11/20* | (2006.01) |
| *G11C 29/14* | (2006.01) |
| *G11C 29/44* | (2006.01) |
| *H01L 25/00* | (2006.01) |

(52) U.S. Cl.
CPC ...... *H01L 23/5226* (2013.01); *H01L 25/0657* (2013.01); *H01L 27/0688* (2013.01); *H01L 27/118* (2013.01); *G06F 11/1666* (2013.01); *G06F 11/2023* (2013.01); *G11C 29/14* (2013.01); *G11C 29/4401* (2013.01); *G11C 29/88* (2013.01); *H01L 25/50* (2013.01); *H01L 2225/06541* (2013.01); *H01L 2225/06565* (2013.01)

(58) Field of Classification Search
CPC ....... H01L 23/5226; H01L 2225/06541; H01L 2225/06565
USPC ........................................................ 257/678
See application file for complete search history.

(56) References Cited

U.S. PATENT DOCUMENTS

| | | | |
|---|---|---|---|
| 10,331,345 B2 | 6/2019 | Fang et al. | |
| 10,461,076 B1 | 10/2019 | Brewer | |
| 10,707,197 B1 | 7/2020 | Brewer | |
| 10,991,684 B2 | 4/2021 | Brewer | |
| 11,488,945 B2 * | 11/2022 | Brewer | ................ G11C 29/886 |
| 2010/0199017 A1 | 8/2010 | Hollis | |
| 2014/0136903 A1 | 5/2014 | Hyde et al. | |
| 2015/0194224 A1 | 7/2015 | Jeddeloh | |
| 2017/0140821 A1 | 5/2017 | Mazed | |
| 2017/0322749 A1 | 11/2017 | Qawami et al. | |
| 2018/0096971 A1 | 4/2018 | Pappu et al. | |
| 2018/0190353 A1 | 7/2018 | Srinivasan et al. | |
| 2019/0004729 A1 | 1/2019 | Qawami et al. | |
| 2020/0135719 A1 | 4/2020 | Brewer | |
| 2020/0194412 A1 | 6/2020 | Brewer | |
| 2020/0321325 A1 | 10/2020 | Brewer | |
| 2021/0249396 A1 | 8/2021 | Brewer | |

\* cited by examiner

3D STACKED INTEGRATED CIRCUITS HAVING FUNCTIONAL BLOCKS CONFIGURED TO PROVIDE REDUNDANCY SITES

CROSS REFERENCE TO RELATED APPLICATIONS

The present application is a continuation application of U.S. patent application Ser. No. 17/219,202 filed Mar. 31, 2021, which is a continuation application of U.S. patent application Ser. No. 16/909,873 filed Jun. 23, 2020, issued as U.S. Pat. No. 10,991,684 on Apr. 27, 2021, which is a continuation of U.S. patent application Ser. No. 16/218,901 filed Dec. 13, 2018, issued as U.S. Pat. No. 10,707,197 on Jul. 7, 2020, and entitled "3D Stacked Integrated Circuits Having Functional Blocks Configured to Provide Redundancy Sites", the entire disclosures of which applications are hereby incorporated herein by reference.

FIELD OF THE TECHNOLOGY

At least some embodiments disclosed herein relate to functional blocks implemented or supported by three-dimensional integrated circuits (3D ICs) in general, and more particularly, but not limited to, three-dimensional stacked integrated circuits (3D SICs) having functional blocks configured to provide redundancy sites.

BACKGROUND

Redundancy can include the duplication of components or functions of an electronic system. The purpose of redundancy can be increased reliability of the system, usually in the form of a backup or fail-safe. Also, redundancy can improve actual system performance. In computer science, there are different types of redundancy. For example, hardware redundancy can include dual modular redundancy and triple modular redundancy. Information redundancy can include error detection and correction processes. Time redundancy can include repeating an operation such as multiple executions of a program or multiple copies of data transmitted. Software redundancy can include N-version programming. In general, computer hardware and software structures can be designed with redundant parts, ensuring that if one part fails, the entire structure will not breakdown.

A 3D IC is an integrated circuit built by stacking silicon dies and interconnecting them vertically so that a combination of the dies is a single device. With a 3D IC, electrical paths through the device can be shortened by its vertical layout, which creates a device that can be faster and has a smaller footprint than similar ICs arranged side-by-side. 3D ICs can be generally grouped into 3D SICs, which refers to stacked ICs with through-silicon via interconnects (TSVs), and monolithic 3D ICs, which are generated using fabrication processes to realize 3D interconnects at the local levels of the on-chip wiring hierarchy as set forth by the International Technology Roadmap for Semiconductors (ITRS). Using the fabrication processes to realize the 3D interconnects can produce direct vertical interconnects between device layers. Monolithic 3D ICs are built in layers on a single wafer that is diced into separate 3D ICs.

3D SICs can be produced by three known general methods: a die-to-die, die-to-wafer, or a wafer-to-wafer method. In a die-to-die method, electronic components are generated on multiple dies. Then, the dies are aligned and bonded. A benefit of a die-to-die method is that each die can be tested before aligned and bonded with another die. In a die-to-wafer method, electronic components are generated on multiple wafers. One of the wafers can be diced and then aligned and bonded on to die sites of another wafer, accordingly. In a wafer-to-wafer method, electronic components are generated on multiple wafers, which are then aligned, bonded, and diced into separate 3D ICs.

A TSV is a vertical electrical connection that can pass through a die. TSVs can be a central part to increasing performance in 3D packages and 3D ICs. With TSVs, compared to alternatives for connecting stacked chips, the interconnect and device density can be substantially higher, and the length of the connections can be shorter.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
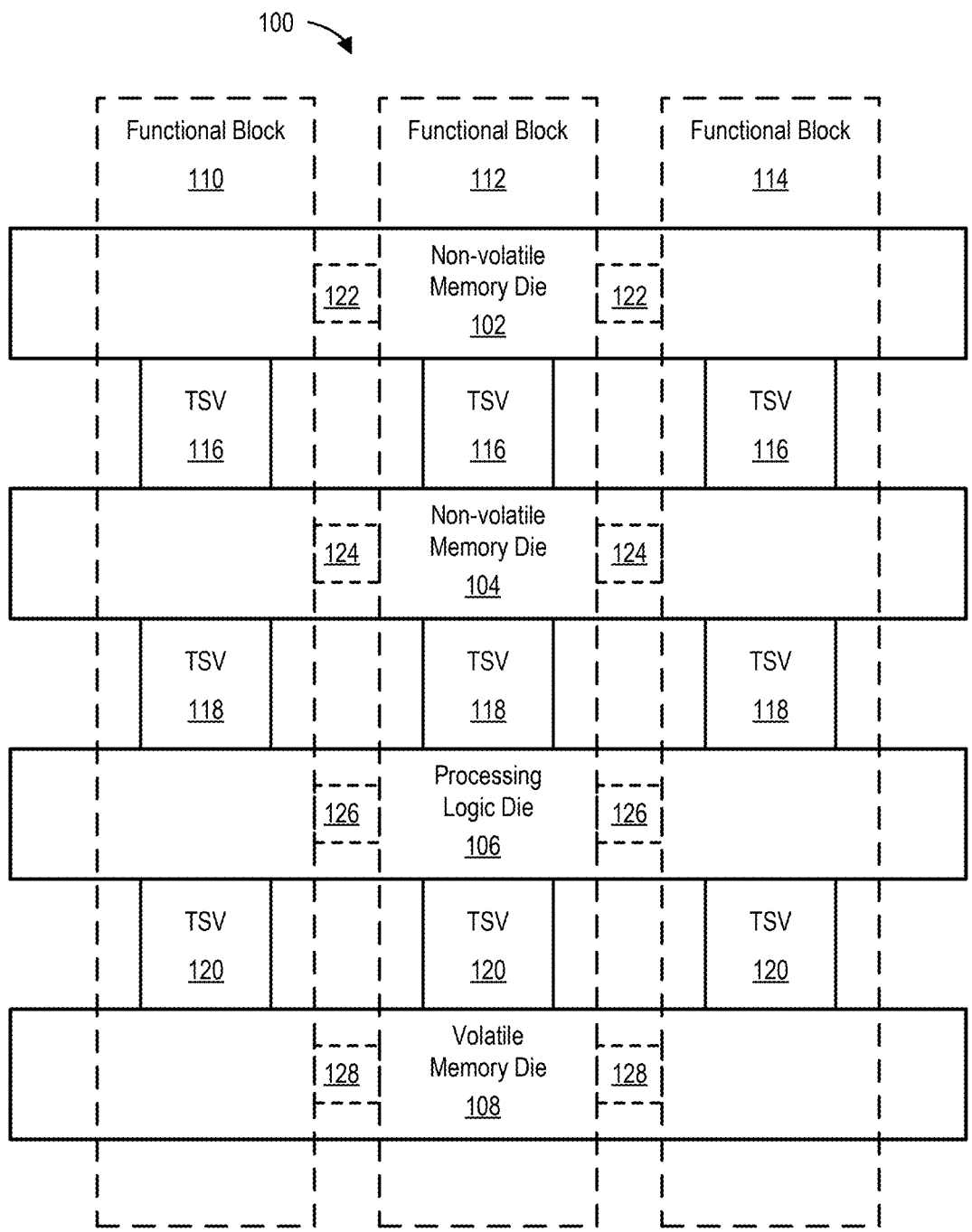
FIG. 1 illustrates a front view of an example 3D SIC having multiple non-volatile memory dies, a volatile memory die, and a processing logic die in accordance with some embodiments of the present disclosure.

At least some aspects of the present disclosure are directed to functional blocks implemented by a 3D SIC. Also, in general, aspects of the present disclosure are directed to functional blocks implemented by a 3D IC.

In general, a 3D IC is an integrated circuit manufactured by stacking silicon wafers or dies and interconnecting them using, for instance, TSVs or Cu—Cu connections, so that they behave as a single device to achieve performance improvements at reduced power and a smaller footprint than conventional two-dimensional devices.

In some embodiments, TSVs can be used, which makes the 3D ICs embodiments that are considered 3D SICs. Embodiments as 3D ICs or as 3D SICs can be created to be heterogeneous, e.g. combining different memory type layers and/or one or more processing layers into a single IC stack. Alternative embodiments of 3D SICs can include monolithic 3D ICs.

Embodiments using monolithic 3D ICs are created in layers on a single semiconductor wafer that is then diced into 3D ICs. These embodiments are advantageous in that there is no need for aligning, thinning, bonding, or TSVs. Although the disclosure herein is mostly focused on 3D SIC embodiments, it is to be understood that the embodiments disclosed herein are not limited to 3D SIC embodiments. Some embodiments can be a monolithic 3D IC instead of a 3D SIC. In such example embodiments, the overall structure of the 3D IC can be similar; however, the interconnects of a monolithic 3D IC includes fabricated vias instead of TSVs.

As for producing 3D SIC embodiments, such embodiments can be generated by a die-to-die, a die-to-wafer, or a wafer-to-wafer production method. In a die-to-die method, thinning and TSV creation can be done before or after bonding in the production method. An example advantage of die-to-die methods is that each component die can be tested before stacking it with other dies. Also, each die can be separately binned for production. In a die-to-wafer method, similar to a wafer-to-wafer method, thinning and TSV creation are performed either before or after bonding. But, an advantage of die-to-wafer over wafer-to-wafer is that additional dies can be added to a stack before dicing, and a die can be tested before adding it to a wafer. In wafer-to-wafer, each wafer can be thinned before or after bonding, and connections are either built into the wafers before bonding or else created in the stack after bonding. With wafer-to-wafer methods, the TSVs can pass through the silicon substrates between active layers and/or between an active layer and an external bond pad. A disadvantage of a wafer-to-wafer method is that a defect in one chip causes a defect in the entire stacked output of the method.

Chip scaling processes are slowly improving in-part because of power-density constraints and interconnects are not becoming faster while transistors are becoming faster in general. 3D ICs address both of these example scaling problems by stacking two-dimensional dies and connecting the dies in a third dimension. Such stacking can possibly make communications between chips faster, compared to a horizontal arrangement of ICs. Also, 3D ICs can provide other possible benefits over horizontally arranging chips, including: a smaller footprint, shorter interconnects, reduced power consumption, circuit security through obscurity, and increased bandwidth.

3D ICs provide greater functionality into a smaller two-dimensional space by taking advantage of adding functionality in layers of a third dimension, and costs can be saved by partitioning a large chip into multiple smaller dies with 3D stacking. To put it another way, the 3D IC manufacturing can be more modular than conventional processes of producing a chip with an array of ICs. Also, 3D ICs can be generated with layers that are created with different processes or different types of wafers, which increases design options. Also, increased connectivity expands design options.

Another advantage is that 3D ICs reduce power consumption by keeping a signal within the device. Shorter electrical connections in two different directions (e.g., horizontally and vertically) also reduce power consumption by producing less parasitic capacitance for example. Reducing the power budget also leads to less heat generation.

Also, 3D ICs can achieve security through obscurity because the stacked die structure complicates attempts to reverse engineer the overall circuitry. Also, sensitive or critical functions can be divided amongst layers of the 3D IC to further conceal such functions. Some embodiments can even have a layer or die dedicated to monitoring or security of the other layers. This is analogous to a firewall layer, where a separate die of the 3D IC provides a hardware firewall for dies to be monitored at runtime. This can be done to protect parts or the entire stack of chips against attacks.

The fundamental structural arrangement of 3D ICs increases bandwidth by allowing large numbers of vias between the dies or layers that in combination can provide much more bandwidth than a conventional bus. Additionally, a set of functional blocks of the 3D SIC can act like a group of separate computers that are networked or clustered. Different functional blocks can have different types of processing units. And, the different types of functional blocks can be complimentary. And, the more related a functional block is to another block the more beneficial it is to locate two functional blocks next to each other. For example, a first block can provide a first data processing operation and a neighboring second block can provide a second data processing operation in a common multiple operation data processing method. Such features can greatly reduce the load of a controller of computerized system. For instance, such features can reduce the load of a central processing unit (CPU).

In embodiments where the blocks are implemented by a 3D SIC, the use of TSVs can make it advantageous to reduce each functional block to one function so that the benefits of TSVs are fully realized. In such embodiments, the functionality of the 3D IC can be increased by increasing the number of functional blocks in the 3D IC and not the number of functions that a single functional block can perform. This way, the TSV or another type of interconnect of a 3D SIC can be used to its full potential.

A TSV is an electrical connection that can pass completely through a silicon wafer or die. With TSVs, interconnections and device density is substantially higher than with conventional interconnections between die. And, length of the connections between die is shorter than conventional interconnections.

Some embodiments can have TSVs added to the 3D IC structure using via-first TSV fabrication. This is a process where the TSVs are fabricated before the components, e.g., transistors, capacitors, and resistors, are patterned onto the wafer. Some embodiments use via-middle TSV fabrication where TSVs are fabricated after the individual devices are patterned but before the metal layers are added to a die or a stack of dies. And, some embodiments use via-last TSV fabrication where TSVs are fabricated after or during the addition of metal layers.

In addition to the way in which TSVs are added to the 3D IC, the layout and design of the TSVs can vary between embodiments described herein. For example, differences in partitioning granularity of functional elements of the dies of the 3D IC can cause variation in the design and layout of TSVs. Some embodiments have gate level partitioning using TSVs and other embodiments have block level partitioning. Gate level partitioning using TSVs is less practical than block level partitioning; thus, to increase the benefit of having more TSVs, functional sub-elements partitioned within a functional block can be connected via TSVs. This can be a middle ground solution.

In some embodiments, a stack of chips or die (stacked in a first direction) can have a processing logic integrated circuit (IC), in addition to memory ICs, such as 3D XPoint memory (3DXP) and dynamic random access memory (DRAM) ICs. Units of processing logic, 3DXP and DRAM can be connected to form a functional block, such as by TSVs. Different functional blocks can be configured differently on demand and/or operate substantially independently from each other in one 3D SIC or, in general, in one 3D IC. The processing logic implements frequently used functions and/or data intensive functions, such that even though the processing logic IC may not have the processing power of a CPU, its advantage in better data access can provide a better overall performance in implementing selected functions. Multiple functional blocks (e.g., multiple column functional blocks within a 3D SIC or 3D IC) can run in parallel and reduce the computation load on the CPU.

As mentioned, in some embodiments, the processing logic IC or die does not have a full array of processing cores that a typical CPU would have. But, in such embodiments, the processing logic implements frequently used functions and/or data intensive functions; thus, having potential to relieve the CPU of significant processing duties and enhancing the performance of the CPU. In such embodiments, a functional block cannot execute a complete set of multi-functional instructions on its own. Therefore, the functional block and the remainder of the 3D IC can be connected to a CPU, and the CPU can instruct the function block to do a task it is configured to do. For example, a functional block of example embodiments can be configured to decrypt, by its processing logic IC, the data stored in its non-volatile memory IC, and insert the decrypted data into its volatile memory to be communicated to the CPU for further processing by CPU. Also, the CPU can provide a request to the volatile memory of a functional block to request the block to generate a result of a certain function, and the CPU can also provide a follow-up request to retrieve the result from the functional block. For instance, the request for generation of the result can be provided from the CPU to the functional block in the form of a write command, and the request to retrieve the result can be provided from the CPU to the functional block in the form of a read command.

FIG. 1 illustrates a front view of a 3D SIC 100 having multiple non-volatile memory dies 102 and 104, a volatile memory die 108, and a processing logic die 106 in accordance with some embodiments of the present disclosure. As shown, the dies are parallel to each other. The 3D SIC 100 also has functional blocks 110, 112, and 114 (as shown in FIG. 1) as well as functional blocks 210, 212, 214, 220, 222, and 224 (as shown in FIGS. 2-5) that traverse and are perpendicular to the multiple non-volatile memory dies 102 and 104, the volatile memory die 108, and the processing logic die 106. The 3D SIC 100 also has TSVs 116, TSVs 118, and TSVs 120 that connect the dies respectively. TSVs 116 are shown in between and connecting the non-volatile memory die 102 to the non-volatile memory die 104. TSVs 118 are shown in between and connecting the non-volatile memory die 104 to the processing logic die 106. TSVs 120 are shown in between and connecting the processing logic die 106 to the volatile memory die 108. It is to be understood that all the TSVs described herein pass through the dies described herein even thought this may not be clear from the drawings. For example, TSVs 116, TSVs 118, and TSVs 120 are parts of single TSVs passing through the dies of the 3D SIC 100, wherein each of the single TSVs passing through the dies are perpendicular to the dies.

The 3D SIC 100 also has interconnects 122, 124, 126, and 128, which are shown as embedded in the dies respectively. Interconnects 122 are shown embedded in the non-volatile memory dies 102. Interconnects 124 are shown embedded in the non-volatile memory dies 104. Interconnects 126 are shown embedded in the processing logic die 106. And, interconnects 128 are shown embedded in the volatile memory die 108. The interconnects 122, 124, 126, and 128 can be perpendicular to the TSVs 116, 118, and 120 (as shown in FIG. 1 and as shown partially in FIG. 5).

It is to be understood that interconnects described herein, such as interconnects 122, 124, 126, and 128, refer to interconnections between components of a chip or die (e.g., copper or metal interconnects, interconnect traces, etc.). The interconnects can include interconnects in the metallization layer of a die or chip.

As depicted, in some embodiments, a 3D SIC can have multiple non-volatile memory dies. In some embodiments, the non-volatile memory dies are slower than the volatile memory dies. Specifically, the non-volatile memory dies have less bandwidth (e.g., the maximum amount of data the die can transfer each second) than the volatile memory dies. The non-volatile memory dies can include 3DXP dies or any other type of electrically addressed memory system die, e.g., a EPROM die, flash memory die, ferroelectric RAM, and magnetoresistive RAM. Each non-volatile memory die can have an array of non-volatile memory partitions. Each partition of the array of non-volatile memory partitions can include an array of non-volatile memory cells and each cell can have a corresponding address.

Figure 2:
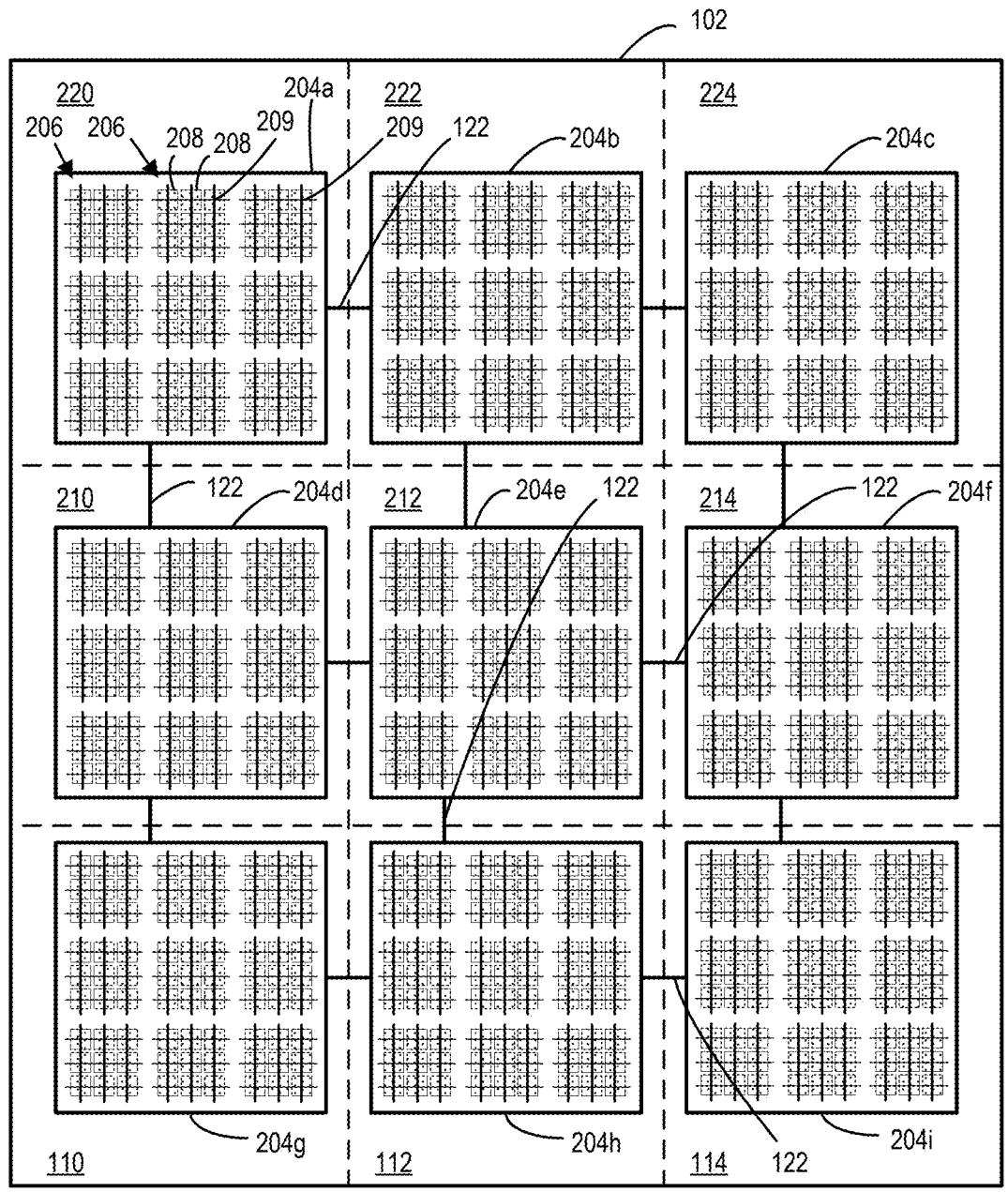
FIG. 2 illustrates a top view of an example non-volatile memory die having multiple non-volatile memory partitions (each partition having multiple non-volatile memory elements) in accordance with some embodiments of the present disclosure.

FIG. 2 illustrates a top view of the non-volatile memory die 102 having multiple non-volatile memory partitions 204a, 204b, 204c, 204d, 204e, 204f, 204g, 204h, and 204i in accordance with some embodiments of the present disclosure. The partitions can be arranged in a second direction (i.e., perpendicular to the first direction of the stacking of the dies of the 3D IC). Each of the partitions 204a, 204b, 204c, 204d, 204e, 204f, 204g, 204h, and 204i has multiple non-volatile memory elements. Each of the partitions illustrated in FIG. 2 shows nine non-volatile memory element clusters 206. And, each of the non-volatile memory element clusters 206 shows nine non-volatile memory elements 208. Thus, each of the partitions illustrated in FIG. 2 has eighty-one memory elements 208. However, it is to be understood that the depiction of eighty-one memory elements is for convenience sake and that in some embodiments each partition could have up to at least a billion memory elements. To put it another way, the number of memory elements per non-volatile memory partition can be enormous and vary greatly. Also, it is to be understood that non-volatile memory die 102 and non-volatile memory die 104 are similar or exactly the same with respect to structure and design.

A 3DXP IC (also known as a 3D XPoint memory IC) uses transistor-less memory elements, each of which has a memory cell and a corresponding address (as well as an optional selector and the cell and optional selector can be stacked together as a column). In examples with memory elements, the memory elements can be connected via two perpendicular layers of interconnects (as shown but not labeled in FIG. 2), where one layer is above the memory elements and the other layer is below the memory elements. Each memory element can be individually selected at a cross point of one wire on each of the two layers of interconnects (e.g., see cross point 209 shown in FIG. 2). Each cross point has an address or is addressable or selectable such as by an address decoder of the 3DXP IC, the 3D IC, or a group of ICs of the 3D IC. 3DXP devices are fast and non-volatile and can be used as a unified memory pool for processing and storage.

As mentioned, the non-volatile memory dies 102 and 104 can be 3DXP dies. Some advantages of using a 3DXP die as the non-volatile memory die of the 3D SIC 100 include that it is bit addressable by an address decoder. An address decoder (not shown in the drawings) used with an embodiment described herein can be a binary decoder that has two or more inputs for address bits and one or more outputs for device selection signals. When the address for a particular device or IC appears on the address inputs, the decoder asserts the selection output for that device or IC. A dedicated, single-output address decoder can be incorporated into each device or IC on an address bus, or a single address decoder can serve multiple devices or ICs.

Also, the 3D SIC can have a volatile memory die (such as a DRAM die or a static random access memory (SRAM) die) including an array of volatile memory partitions. Each partition of the array of volatile memory partitions can include an array of volatile memory cells and each cell can have a corresponding address.

Figure 3:
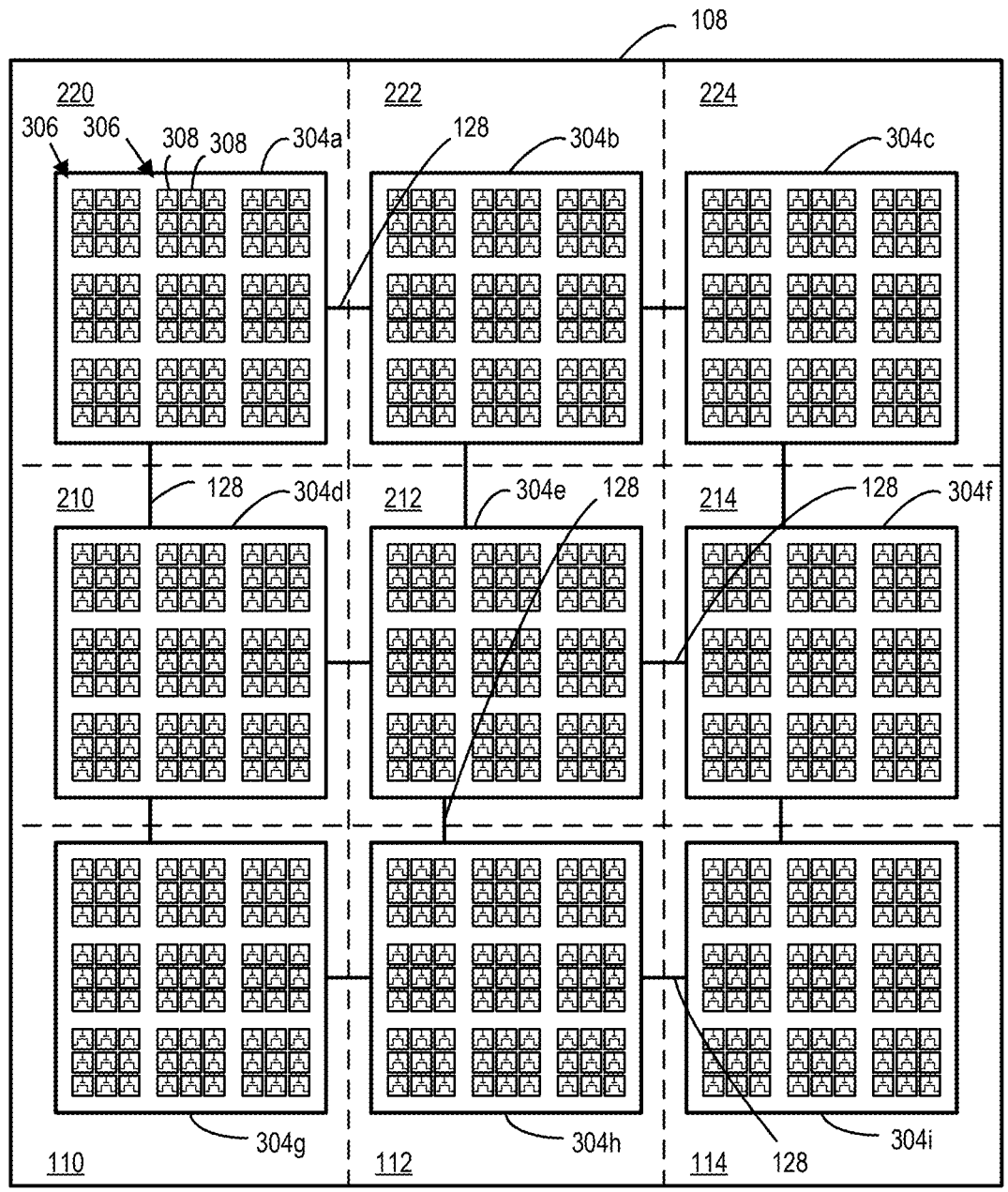
FIG. 3 illustrates a top view of an example volatile memory die having multiple volatile memory partitions (each partition having multiple volatile memory elements) in accordance with some embodiments of the present disclosure.

FIG. 3 illustrates a top view of the volatile memory die 108 having multiple volatile memory partitions 304a, 304b, 304c, 304d, 304e, 304f, 304g, 304h, and 304i in accordance with some embodiments of the present disclosure. The partitions can be arranged in second direction (i.e., perpendicular to the direction of the stacking of the dies of the 3D IC). Each of the partitions 304a, 304b, 304c, 304d, 304e, 304f, 304g, 304h, and 304i has multiple volatile memory elements. Each of the partitions illustrated in FIG. 3 shows nine volatile memory element clusters 306. And, each of the volatile memory element clusters 306 shows nine volatile memory elements 308. Thus, each of the partitions illustrated in FIG. 3 has eighty-one memory elements 308. However, it is to be understood that the depiction of eighty-one memory elements is for convenience sake and that in some embodiments each partition could have up to at least a billion memory elements. To put it another way, the number of memory elements per volatile memory partition can be enormous and vary greatly.

The 3D SIC can also have a processing logic die having an array of processing logic partitions. Each partition can have a separate field-programmable gate array (FPGA) or another type of processing logic device. The processing logic die can include a controller unit and an arithmetic/logic unit. For instance, the arithmetic/logic unit can include an FPGA.

Figure 4:
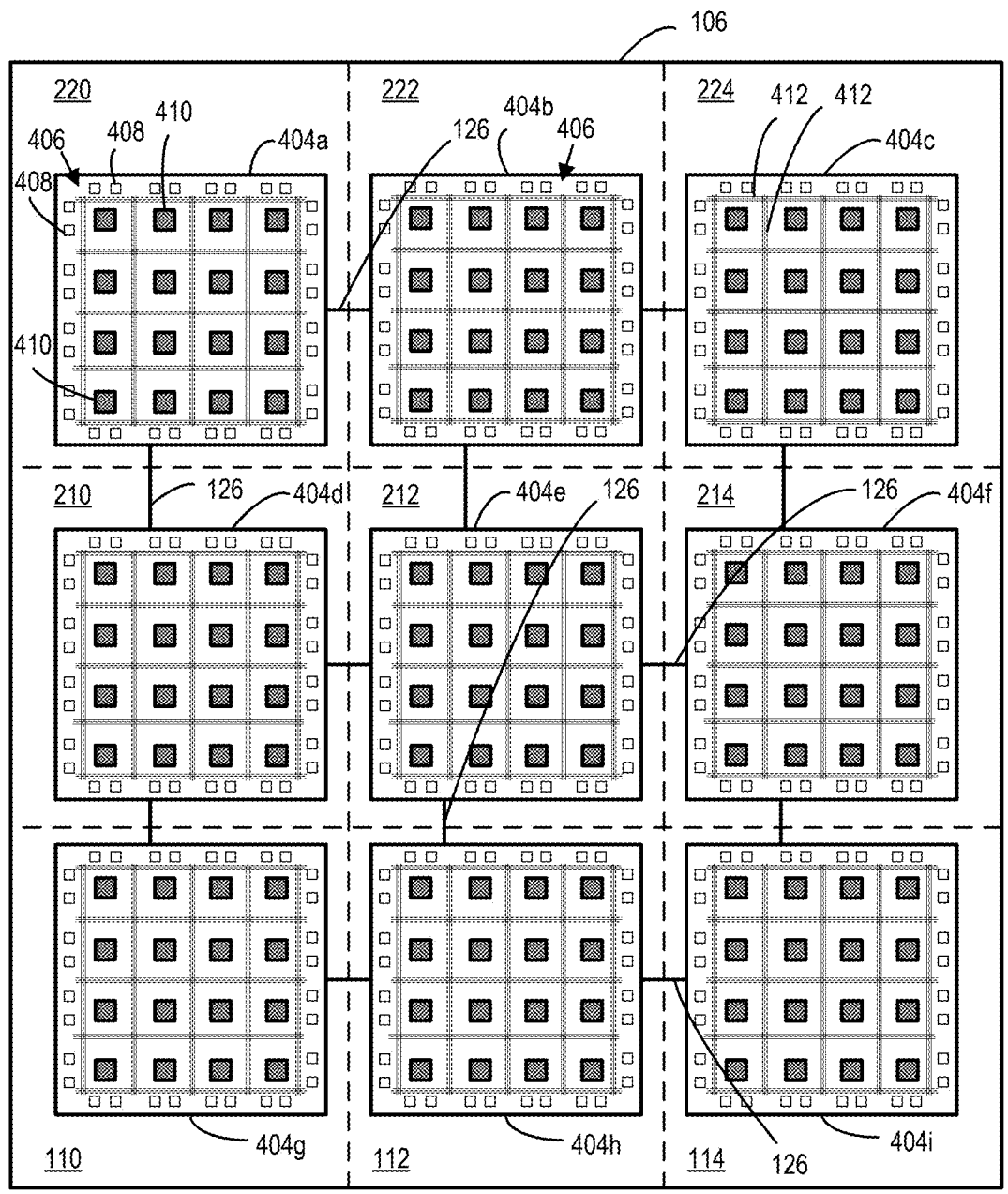
FIG. 4 illustrates a top view of an example processing logic die having multiple processing logic partitions (each partition having a separate field-programmable gate array) in accordance with some embodiments of the present disclosure.

FIG. 4 illustrates a top view of the processing logic die 106 having multiple processing logic partitions 404a, 404b, 404c, 404d, 404e, 404f, 404g, 404h, and 404i in accordance with some embodiments of the present disclosure. FIG. 4 shows each of the partitions 404a, 404b, 404c, 404d, 404e, 404f, 404g, 404h, and 404i having a separate FPGA 406. As shown, each of the nine FPGAs 406 illustrated in FIG. 4 has thirty-two input/output blocks 408 and sixteen logic blocks 410. Also, FIG. 4 shows programmable or non-programmable interconnects 412 between the input/output blocks 408 and the logic blocks 410 of each of the nine FPGAs 406. It is to be understood that the depiction of the amount of input/output units and logic units of an FPGA 406 is for convenience sake and that in some embodiments each FPGA of a partition could have more or less input/output units and logic units depending on the embodiment of the corresponding functional block. Also, even though FIG. 4 shows one FPGA per partition, it is to be understood that each processing logic partition can have multiple FPGAs in other embodiments of the 3D SIC or the processing logic die. To put it another way, the number of specific parts of the processing logic die can vary greatly.

FIGS. 2, 3, and 4 also show the functional blocks 110, 112, 114, 210, 212, 214, 220, 222, and 224 of the 3D SIC 100. FIG. 2 shows a top view of respective sections of the functional blocks at the non-volatile memory die 102. FIG. 3 shows a top view of respective sections of the functional blocks at the volatile memory die 108. FIG. 4 shows a top view of respective sections of the functional blocks at the processing logic die 106.

FIGS. 2, 3, and 4 also show the interconnects 122, 128, and 126 interconnecting the non-volatile memory partitions, the volatile memory partitions, and the processing logic partitions respectively. Thus, the interconnects 122, 128, and 126 are also shown interconnecting the functional blocks of the 3D SIC 100 at each layer of the 3D SIC. Specifically, as shown in FIG. 2, the interconnects 122 interconnect the non-volatile memory partitions 204a, 204b, 204c, 204d, 204e, 204f, 204g, 204h, and 204i of the non-volatile memory die 102. As shown in FIG. 3, the interconnects 128 interconnect the volatile memory partitions 304a, 304b, 304c, 304d, 304e, 304f, 304g, 304h, and 304i of the volatile memory die 108. And, as shown in FIG. 4, the interconnects 126 interconnect the processing logic partitions 404a, 404b, 404c, 404d, 404e, 404f, 404g, 404h, and 404i of the processing logic die 106.

In the 3D SIC, the non-volatile memory die, the volatile memory die, and the processing logic die are stacked in a first direction (e.g., vertically), and the processing logic die can be stacked in between the non-volatile memory die and the volatile memory die. The 3D SIC can also have an array of functional blocks which are made up from the dies of the 3D SIC. To put it another way, the non-volatile memory die, the volatile memory die, and the processing logic die are arranged to form the array of functional blocks. At least two functional blocks of the array of functional blocks each can include a different data processing function that reduces the computation load of a controller—such reducing the computational load of a CPU. Each functional block of the array of functional blocks can include a respective column of the 3D SIC. A respective column of the 3D SIC can include a respective non-volatile memory partition of the array of non-volatile memory partitions, a respective volatile memory partition of the array of volatile memory partitions, and a respective processing logic partition of the array of processing logic partitions. A respective processing logic partition can be stacked in the first direction in between a respective non-volatile memory partition and a respective volatile memory partition.

Figure 5:
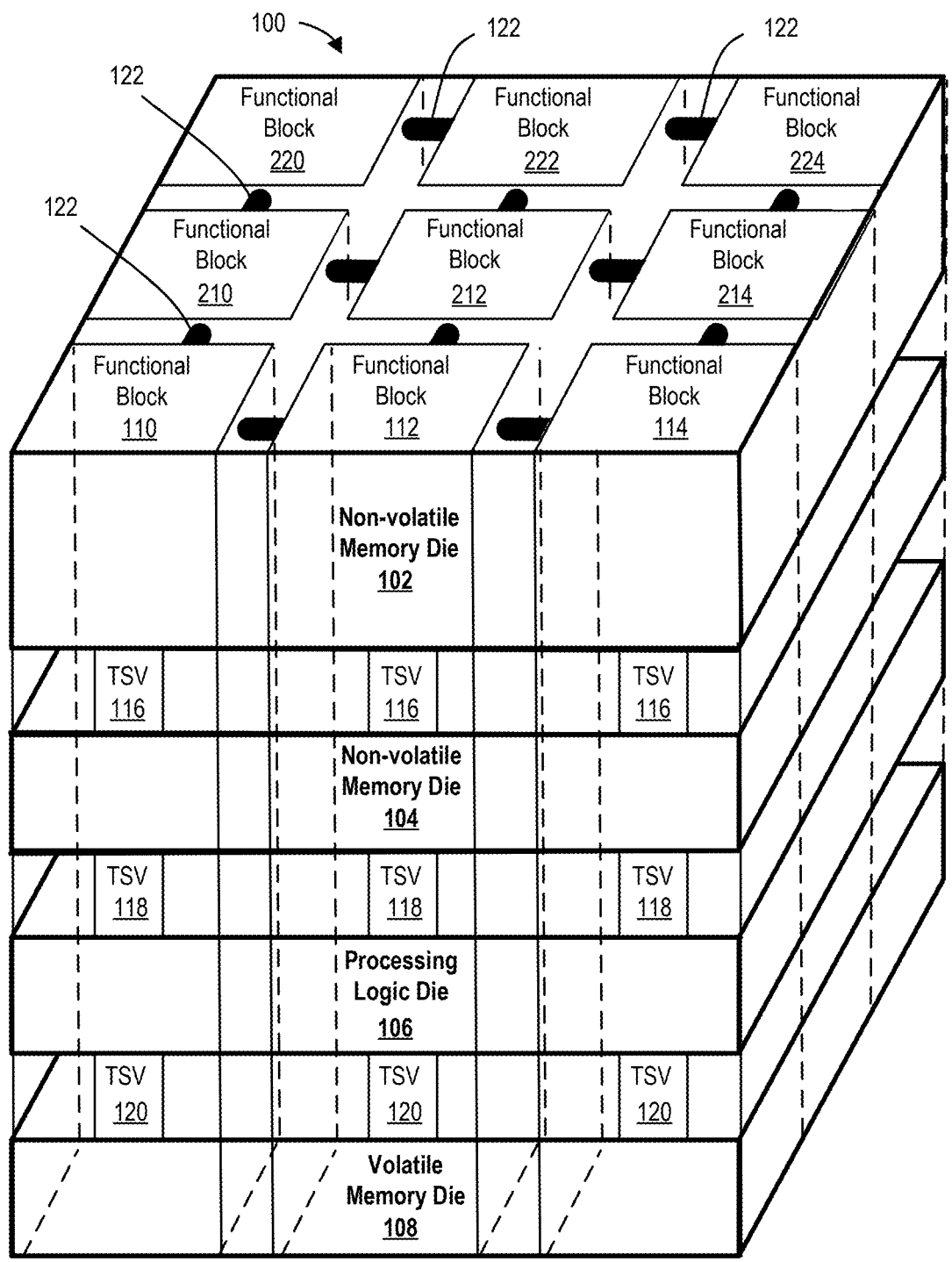
FIG. 5 illustrates a perspective view of the example 3D SIC illustrated in FIG. 1 having multiple non-volatile memory dies, a volatile memory die, and a processing logic die in accordance with some embodiments of the present disclosure.

FIG. 5 illustrates a perspective view of the 3D SIC 100 illustrated in FIG. 1 having multiple non-volatile memory dies 102 and 104, volatile memory die 108, and processing logic die 106 in accordance with some embodiments of the present disclosure. FIG. 5 shows perspective views of the non-volatile memory dies 102 and 104, the volatile memory die 108, and the processing logic die 106 and how the dies are stacked in a first direction (e.g., vertically), and how the processing logic die can be stacked in between the non-volatile memory dies and the volatile memory die. FIG. 5 also shows the array of functional blocks completely in that all the functional blocks 110, 112, 114, 210, 212, 214, 220, 222, and 224 of the 3D SIC 100 are depicted.

It is to be understood that the number of functional blocks of a 3D SIC can vary depending on the embodiment of the 3D SIC. Each functional block of the array of functional blocks illustrated in FIGS. 1-5 can include a respective column of the 3D SIC 100, as shown. And, as shown by the combination of FIGS. 1-5, a column of the 3D SIC, having a single functional block, can include a respective non-volatile memory partition of the array of non-volatile memory partitions, a respective volatile memory partition of the array of volatile memory partitions, and a respective processing logic partition of the array of processing logic partitions. Also, shown by the combination of these drawings, a respective processing logic partition can be stacked in a first direction (e.g., vertically) in between a respective non-volatile memory partition and a respective volatile memory partition.

In some embodiments, each of two abutting functional blocks of the array of functional blocks can have different particular data processing functions that are commonly used together for a greater particular data processing function. Particular data processing functions can include fundamental processes of a CPU, such as decoding processes of a decode operation of CPU.

Embodiments of the 3D IC or at least a group of functional blocks of some embodiments can function as an instruction decoder for a CPU. This way the CPU can reserve resources for fetching and execution operations, when connected to such embodiments of the 3D IC.

Particular data processing functions can also include functions of an arithmetic logic unit of a CPU, such as integer arithmetic and bitwise logic operations. This way the CPU can reserve resources by delegating arithmetic logic unit operations to such embodiments of the 3D IC.

Also, embodiments of the 3D IC or at least a group of functional blocks of some embodiments can function as different types of encoders and/or decoders besides those usually hardwired or programmed into a CPU. For example, embodiments of the 3D IC or at least a group of functional blocks of some embodiments can function as an encryption block wherein the 3D IC or at least a group of functional blocks have a cipher that can generate a ciphertext. Also, embodiments can function as a decryption block. In one embodiment, one or more blocks of the 3D IC can be dedicated to encryption and other one or more blocks of the same 3D IC can be dedicated to decryption. Also, embodiments of the 3D IC or at least a group of functional blocks of some embodiments can function as one or more data processing intensive operations, such as data intensive operations of a type of machine learning.

The 3D SIC can also include a first set of TSVs that connect the respective non-volatile memory partition and the respective processing logic partition in the respective column of the 3D SIC (e.g., TSVs 118 as shown in FIGS. 1 and 5) as well as a second set of TSVs that connect the respective volatile memory partition and the respective processing logic partition in the respective column of the 3D SIC (e.g., TSVs 120 as shown in FIGS. 1 and 5).

In some embodiments, processing logic die can include a control unit and an arithmetic/logic unit, and each of the memory ICs can include storage parts that are addressable by an address decoder and/or have predefined addresses. In such embodiments, the control unit is connected in a first direction (e.g., vertically) with the storage parts of the memory ICs and the arithmetic/logic unit is connected in the first direction with the storage parts of the memory ICs and/or the parts of the IC are connected to the storages parts of the memory ICs via an address decoder.

In some embodiments including the control unit and the arithmetic/logic unit, the control unit is configured to, during an instruction time, get instructions from the volatile memory IC of the 3D IC and decode the instructions and direct data to be moved from the volatile memory IC to the arithmetic/logic unit according to at least part of the instructions. And, the arithmetic/logic unit can be configured to, during an execution time, execute the at least part of the instructions and store a result of the execution of the at least part of the instructions in a non-volatile memory IC of the 3D IC.

In such embodiments, the arithmetic/logic unit is given control and performs the actual operation on the data. The combination of instruction time and execution time can be a machine cycle of the 3D IC, and in some embodiments, the control unit can direct, during the execution time, the volatile memory IC and/or the non-volatile memory IC to release the result to an output device or a storage device external of the apparatus. In some embodiments, connections between the control and arithmetic/logic units and the memory units of the memory ICs are connections that can be TSVs. To put it another way, the control unit can be connected in a first direction (e.g., vertically), by a plurality of electrical connections, with the memory elements of the memory ICs and the arithmetic/logic unit is connected, by a plurality of electrical connections, with the memory elements of the memory ICs.

The memory cells and logic units of each IC or die of the 3D IC can be connected to each other by a plurality of electrical connections. For example, the 3D SIC can also include a first set of interconnects that connect non-volatile memory partitions of the array of non-volatile memory partitions in a second direction that is orthogonal to the first direction (e.g., a horizontal direction), e.g., interconnects 122 as shown in FIGS. 1 and 2, a second set of interconnects that connect volatile memory partitions of the array of volatile memory partitions in the second direction, e.g., interconnects 128 as shown in FIGS. 1 and 3, and a third set of interconnects that connect processing logic partitions of the array of processing logic partitions in the second direction, e.g., interconnects 126 as shown in FIGS. 1 and 4. In some embodiments having the three sets of interconnects, an interconnect of the first set of interconnects only connects a non-volatile memory partition of the array of non-volatile memory partitions to another non-volatile memory partition directly next to the non-volatile memory partition (e.g., see interconnects 122 as shown in FIGS. 1 and 2). Also, in such embodiments, an interconnect of the second set of interconnects only connects a volatile memory partition of the array of volatile memory partitions to another volatile memory partition directly next to the volatile memory partition (e.g., see interconnects 128 as shown in FIGS. 1 and 3). And, an interconnect of the third set of interconnects only connects a processing logic partition of the array of processing logic partitions to another processing logic partition directly next to the processing logic partition (e.g., see interconnects 126 as shown in FIGS. 1 and 4).

Some exemplary embodiments of the 3D SIC includes a processing logic die, a 3DXP die, and a DRAM die, with the processing logic die being stacked between the 3DXP die and the DRAM die. In such exemplary embodiments, a set of TSVs interconnect the processing logic die, the 3DXP die, and the DRAM die. In such exemplary embodiments or some other exemplary embodiments, the 3D SIC includes a 3DXP die having an array of non-volatile memory partitions, with each partition of the array of non-volatile memory partitions having an array of non-volatile memory cells. In such embodiments, a volatile memory die has an array of volatile memory partitions, with each partition of the array of volatile memory partitions having an array of volatile memory cells. Also, in such embodiments, a processing logic die is included and has an array of processing logic partitions. And, the 3DXP die, the volatile memory die, and the processing logic die are stacked in a first direction (e.g., vertically) with the processing logic die stacked in between the 3DXP die and the volatile memory die. Further, such embodiments of the 3D SIP can include a first set of TSVs that connect, in the first direction, a respective non-volatile memory partition and a respective processing logic partition in a respective column of the 3D SIC. And, such embodiments can include a second set of TSVs that connect, in the first direction, a respective volatile memory partition and the respective processing logic partition in the respective column of the 3D SIC.

The 3D SIC can also have multiple non-volatile memory dies (as shown in FIGS. 1 and 5). For example, the 3D SIC can include a second non-volatile memory die that can include a second array of non-volatile memory partitions. And, each partition of the second array of non-volatile memory partitions can have an array of non-volatile memory cells. In embodiments where the 3D SIC has multiple non-volatile memory dies, the non-volatile memory dies (such as the first and second non-volatile memory dies) can be grouped together such that the processing logic die is in between the volatile memory die and the group of non-volatile memory dies (as shown in FIGS. 1 and 5).

In some embodiments of the 3D SIC, each functional block the 3D SIC can have a respective communications interface (i.e., a respect port) configured to communicatively couple the block to a bus so that each block can operate in parallel and independently of the other. Additionally or alternatively, groups of at least two functional blocks of the 3D SIC each share a respective communications interface configured to communicatively couple the at least two functional blocks to a bus, so that each group of at least two functional blocks can operate in parallel and independently of another group of at least two functional blocks. Additionally, or alternatively, the 3D SIC can have one or more universal communications interfaces (i.e., one or more universal ports) configured to communicatively couple any one or all of the functional blocks of the 3D SIC to a bus.

Figure 6:
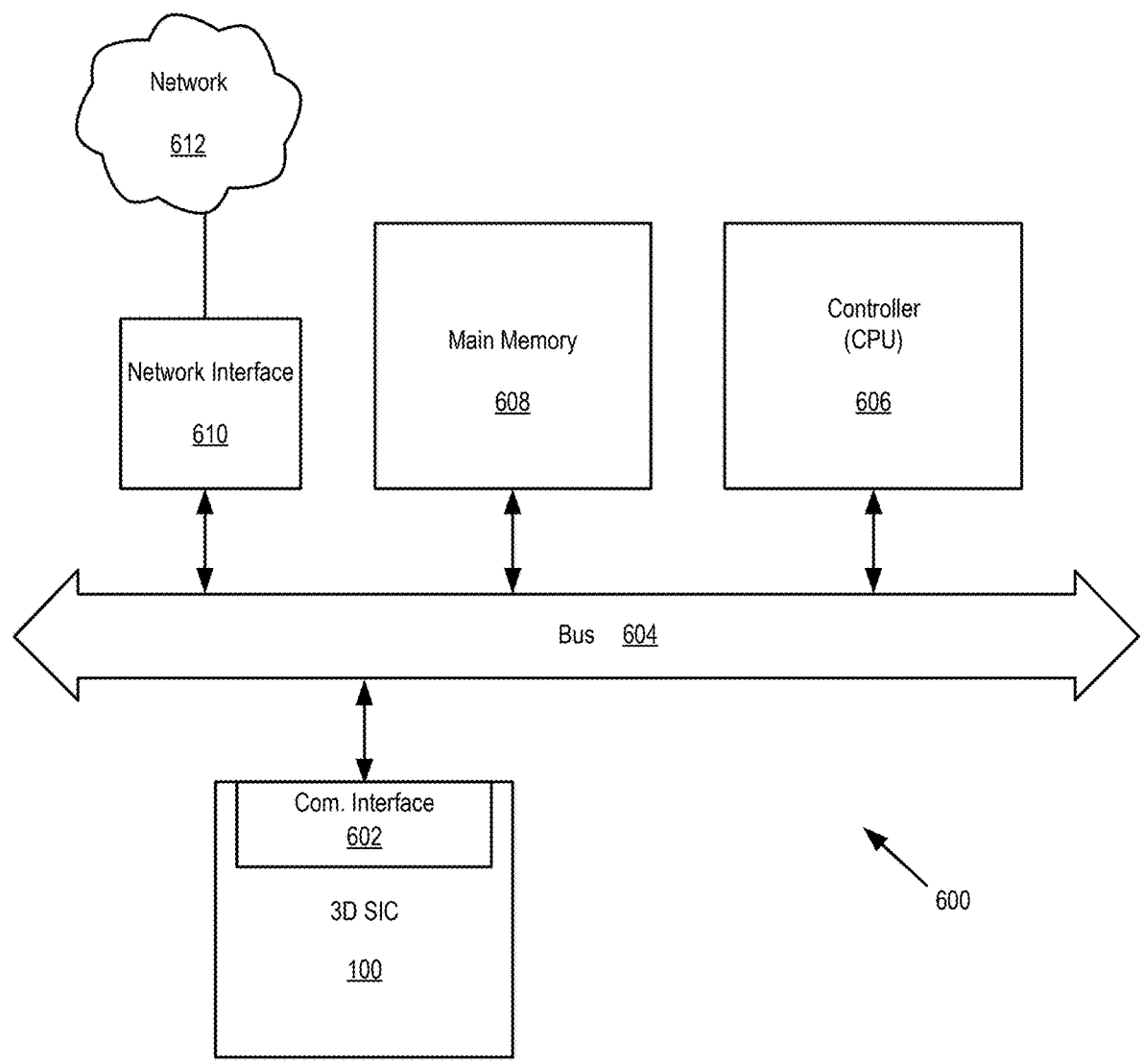
FIG. 6 illustrates a block diagram of an example computer system in which embodiments of the present disclosure can operate.

FIG. 6 illustrates a block diagram of an example computer system 600 in which embodiments of the present disclosure can operate. As shown in FIG. 6, the computer system 600 includes the 3D SIC 100 that includes a communications interface 602 (or also referred to as port 602). The communications interface 602 is communicatively coupled to a bus 604 of the computer system 600. The bus 604 is communicatively coupled to a controller of the computer system 600 (e.g., a CPU of the system 600) as well as a main memory 608 and network interface 610 of the computer system 600. As shown in FIG. 6, the network interface 610 communicatively couples the computer system 600 to a computer network 612.

The computer system 600 can be or include a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that computerized system. Further, while a single computer system 600 is illustrated, the term "computer system" shall also be taken to include any collection of computer systems. The bus 604 can be or include multiple buses. The controller 606 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Controller 606 can also be one or more special-purpose processing devices such as an application specific integrated circuit (ASIC), an FPGA, a digital signal processor (DSP), network processor, or the like. The main memory 608 can be a read-only memory (ROM), flash memory, DRAM such as synchronous DRAM (SDRAM) or Rambus DRAM (RDRAM), and/or SRAM.

Referring to FIGS. 1 and 6, in some embodiments, the port 602 can be configured to communicatively couple the volatile memory die 108 to the bus 604. In such an arrangement, the controller 606 can delegate data processing functions to the 3D SIC 100 via the bus 604 and the volatile memory die 108. The delegated data processing functions can be data intensive functions or commonly used functions of the controller 606. As mentioned, in some embodiments, the processing logic IC or die does not have a full array of processing cores that a typical CPU would have. But, in such embodiments, the processing logic can implement frequently used functions and/or data intensive functions; thus, having potential to relieve the CPU of significant processing duties and enhancing the performance of the CPU. Also, in the depicted embodiments, a functional block cannot execute complete set of multifunctional instructions on its own. Therefore, a functional block and the remainder of the 3D SIC 100 can be connected to a controller (such as a CPU) and the controller can instruct the function block to do a task it is configured to do.

For example, a functional block of example embodiments can be configured to decrypt, by its processing logic partition, the data stored in its corresponding non-volatile memory partition, and insert the decrypted data into its corresponding volatile partition to be communicated to the controller for further processing by controller.

Also, in general, the controller can provide a request to the volatile memory partition of a functional block to request the block to generate a result of a certain function, and the controller can also provide a second or follow-up request to retrieve the result from the functional block. For instance, the request for generation of the result can be provided from the controller to the functional block in the form of a write command, and the request to retrieve the result can be provided from the controller to the functional block in the form of a read command.

Figure 7:
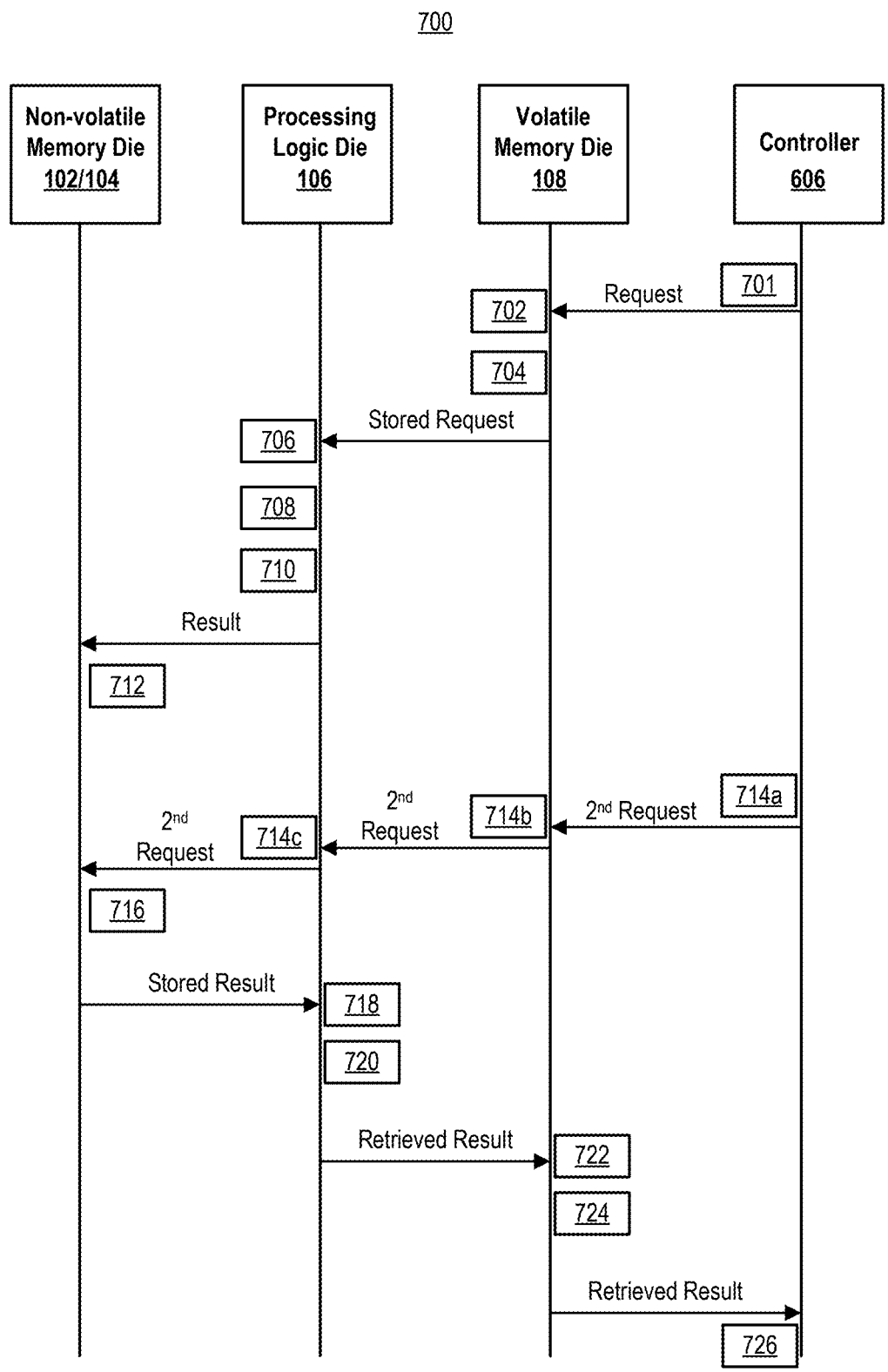
FIG. 7 illustrates a flow diagram of an example method in which embodiments of the present disclosure can perform along with a controller.

FIG. 7 illustrates a flow diagram of an example method 700 in which embodiments of the 3D SIC (e.g., 3D SIC 100 of FIGS. 1-6) can interact with a controller (e.g., controller 606 of FIG. 6) via a bus (e.g., bus 604 of FIG. 6).

The method 700 in general can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order and performed by particular hardware/software, unless otherwise specified, the order and hardware/software of the processes can be modified. Thus, the illustrated embodiments should be understood only as examples, and the illustrated processes can be performed in a different order and/or by different hardware/software, and some processes can be performed in parallel. Additionally, one or more processes can be omitted in various embodiments. Thus, not all processes are required in every embodiment. Other process flows are possible as well.

Specifically, the method 700 can be performed by at least the non-volatile memory die 102 and/or the non-volatile memory die 104, the processing logic die 106, the volatile memory die 108, and the controller 606 (as illustrated in FIG. 7). At block 701, the controller 606 communicates a request, via a bus. The request of the controller 606 is configured to instruct the 3D SIC to generate a result of a particular data processing function. Such a request can be delivered to the 3D SIC via a write command of the controller 606. For example, if a write command is used by the controller 606 to make the request, then the request is sent to the selected volatile memory partition of the volatile memory die 108. Alternatively, an execute command can be used by the controller 606 to make the request, and in such instances the request can be directly sent to the selected processing logic partition of the processing logic die 106.

At block 702, the volatile memory die 108 receives the request via the bus. The volatile memory die 108 can be configured to receive, from the bus through the port 602, the request of the controller. In addition to being configured to instruct the 3D SIC to generate a result of a particular data processing function, the request can include at least one input parameter of the particular data processing function. At block 704, the volatile memory die 108 stores the request and communicates the request to the processing logic die 106. The volatile memory die 108 can be configured to store the request in at least one volatile partition of the volatile memory die.

At block 706, the stored request is received by the processing logic die. And, at block 706, the at least one input parameter of the particular data processing function can be received by the at least one processing logic partition through a TSV connecting the at least one volatile partition of the volatile memory die and the at least one processing logic partition.

At block 708, the processing logic die generates the result according to the stored request. At least one processing logic partition of the processing logic die 106 can include the particular data processing function and the particular data processing function can generate the result according to the stored request and the at least one input parameter of the particular data processing function. The particular data processing function can be hardwired into the at least one processing logic partition of the processing logic die. Alternatively, the particular data processing function can be configured, by the controller 606 or another controller, in the at least one processing logic partition of the processing logic die temporarily. For example, the particular data processing function can be implemented by an FPGA configurable by the controller 606 or another controller.

At block 710, the processing logic die 106 communicates the result to the non-volatile memory die 102 and/or the non-volatile memory die 104. The processing logic die 106 can be configured to communicate the generated result of the particular data processing function to the non-volatile memory die via a TSV connecting at least one non-volatile partition of the non-volatile memory die and the at least one processing logic partition.

At block 712, the non-volatile memory die 102 and/or the non-volatile memory die 104 receives and stores the result that is communicated from the processing logic die 106. The non-volatile memory die 102 and/or the non-volatile memory die 104 can be configured to store the generated result in at least one non-volatile partition and communicate the stored result to the processing logic die 106 upon the processing logic die requesting the stored result. The processing logic die 106 requesting the stored result can be in response to the volatile memory die 108 requesting the stored result which can be in response to the controller 606 requesting the stored result via the bus 604.

The processing logic die 106 can be configured to retrieve the stored result from the non-volatile memory die via a TSV connecting the at least one non-volatile partition and the at least one processing logic partition. And, the 3D SIC can be configured to communicate the retrieved result to the volatile memory die via a TSV connecting the at least one volatile partition and the at least one processing logic partition. The volatile memory die can be configured to receive and store the retrieved result in the at least one volatile partition, and communicate, via the port, the stored retrieved result to the bus according to a second request of the controller, when the second request of the controller is configured to instruct the 3D SIC to retrieve a result generated by the particular data processing function. In some examples, where a read command is used by the controller 606 to make the second request, the second request is sent to the selected volatile memory partition of the volatile memory die 108.

With respect to FIG. 7, at block 714*a*, the controller communicates the second request that is configured to instruct the 3D SIC to retrieve a result generated by the particular data processing function. At block 714*b*, the second request is received, stored, and sent to the processing logic die 106, by the volatile memory die 108. At block 714*c*, the second request is received, stored, and forwarded to the non-volatile memory die 102 and/or the non-volatile memory die 104, by the processing logic die 106.

At block 716, in response to block 714*c*, the non-volatile memory die 102 and/or the non-volatile memory die 104 communicates the stored result to the processing logic die 106. At block 718, the processing logic die 106 receives the retrieved result, and at block 720, the processing logic die 106 communicates the retrieved result to the volatile memory die 108. The processing logic die 106 can be configured to retrieve the stored result from the non-volatile memory die via the TSV connecting the at least one non-volatile partition and the at least one processing logic partition. And, the processing logic die 106 can be configured to communicate the retrieved result to the volatile memory die via the TSV connecting the at least one volatile partition and the at least one processing logic partition.

At block 722, the volatile memory die 108 receives and stores the retrieved result sent from the processing logic die 106. At block 724, the retrieved result is then communicated to the controller 606, by the volatile memory die 108. The volatile memory die can be configured to receive and store the retrieved result in the at least one volatile partition as well as be configured to communicate, via the port, the stored retrieved result to the bus according to a second request of the controller configured to instruct the 3D SIC to retrieve a result generated by the particular data processing function.

At block 726, the controller 606 receives the retrieved result. The retrieved result can be used by the controller 606 for another processing step or outputted by the controller to another device.

In such embodiments, at least two of a volatile partition, a non-volatile partition, and a processing logic partition can be in the same one or more columns of the 3D SIC. For example, a volatile partition, a non-volatile partition, and a processing logic partition used together can be in the same one or more columns of the 3D SIC. Also, in some embodiments, each of two abutting functional blocks of the array of functional blocks can have different sub-particular data processing functions of the particular data processing function.

A particular data processing function (such as the particular data processing function described with the method 700) can include a fundamental process of the controller 606. For example, if the controller 606 is a CPU, the fundamental process can be a decoding process of the decode operation of a CPU. The processing logic die 106 can be programmed or hardwired as a decoder for a CPU or at least a common part or data intensive part of a decoder for a CPU. This way a CPU can reserve resources for fetching and execution operations, when connected to the 3D SIC 100.

The particular data processing function can also include the processing logic providing at least part of the functionality of an arithmetic logic unit of a CPU and such functionality can be programmed or hardwired into the processing logic die 106. And, abutting partitions of the processing logic die 106 can provide sub-operations of an arithmetic logic unit such as different integer arithmetic and bitwise logic operations. This way the CPU can reserve resources by delegating arithmetic logic unit operations to the 3D SIC 100.

Also, the processing logic die 106 can function as different types of encoders and/or decoders besides those usually hardwired or programmed into a CPU. For example, with embodiments of the 3D SIC 100 or at least a group of functional blocks of some embodiments, the 3D SIC 100 can provide an encryption function wherein the 3D IC or at least a group of functional blocks have a cipher hardwired or programmed into the processing logic die 106 so that the die can generate a ciphertext and then the ciphertext can be stored immediately in the non-volatile memory die 102 and/or the non-volatile memory die 104 of the 3D SIC 100 for subsequent retrieval by the controller 606. And, the processing logic die 106 or partitions of the die can function as a decryption algorithm. In one embodiment, one or more blocks of the 3D SIC 100 can be dedicated to encryption and other one or more blocks of the 3D IC can be dedicated to decryption.

Also, the 3D SIC 100 or at least a group of functional blocks of some embodiments can function as one or more certain data processing intensive operations, such as selected data intensive operations of a type of machine learning. And, data intensive operations that are immediately preceding or following each other in a machine learning algorithm or another type of complex computerized algorithm can be implemented by blocks of the 3D SIC 100 that are abutting each other. Thus, speeding up the transitional time between operations of an algorithm as well as providing other benefits such as reduced power consumption.

In some embodiments, a first memory IC of a 3D IC can provide non-volatile storage parts when the apparatus is powered on. Each non-volatile storage part of the non-volatile storage parts stores a bit while receiving power or not while receiving power. Also, a second memory IC of the 3D IC can provide volatile storage parts when the apparatus is powered on. Each volatile storage part of the volatile storage parts stores a bit only while receiving power. In such embodiments, electrical connections of the 3D IC can communicatively couple, in a second direction that is orthogonal to the first direction (e.g., a horizontal direction), first storage parts of the first memory IC to each other and second storage parts of the second memory IC to each other when the apparatus is powered on. And, electrical connections in a first direction (e.g., vertically) of the 3D IC can communicatively couple a control unit and an arithmetic/logic unit of a processing logic IC of the 3D IC to the storage parts of the first and second memory ICs to control use the storage parts, when the apparatus is powered on.

In such embodiments, during a machine cycle of the 3D IC, the control unit can get instructions from the first memory IC and/or the second memory IC during the instruction time of the machine cycle. And, during a machine cycle of the 3D IC the control unit or a decoder controlled by the control unit can decode the instructions and direct data to be moved from the first memory IC and/or the second memory IC to the arithmetic/logic unit according to at least part of the instructions during the instruction time. Also, during a machine cycle, the arithmetic/logic unit can execute the at least part of the instructions during the execution time of the machine cycle, and store a result of the execution of the at least part of the instructions in the first memory IC and/or the second memory IC during the execution time. Further, during a machine cycle, the control unit can direct the first memory IC and/or the second memory IC to release the result to an output device or a storage device external to the apparatus during the execution time.

In one example system of some embodiments, the system can include a first functional block that includes a first processing logic IC, a first memory IC, and a second memory IC. The first processing logic IC, the first memory IC, and the second memory IC can be arranged in a first direction (e.g., vertically) as a stack of ICs to form the first functional block. The system can also include a second functional block that can include a second processing logic IC, a third memory IC, and a fourth memory IC. The second processing logic IC, the third memory IC, and the fourth memory IC can be arranged in the first direction as a stack of ICs to form the second functional block. The system can also include at least one bus or an interconnect that communicatively couples the first functional block and the second functional block.

In such an example system, the first and second functional blocks are each configured differently from each other for different respective data processing functions. The data processing functions can be different frequently used functions and/or data intensive functions, such that even though each processing logic IC of a block may not have the processing power of a CPU, its advantage in improved (e.g., closer) data access to non-volatile and volatile memory so that it can provide a better overall performance in implementing selected functions. Each functional block of the first and second functional blocks can be configurable on demand by a controller (e.g., a CPU) that is connected to the functional blocks via a wired and/or wireless bus. Each functional block of the first and second functional blocks can be configured to reduce the computation load of the controller. The configuration of each functional block of the first and second functional blocks can include on demand configuration of the respective processing logic IC of the functional block. Each functional block of the first and second functional blocks can be configured to operate independently from each other. Each functional block of the first and second functional blocks is configured to operate in parallel to provide parallel data processing.

In one example method of some embodiments implemented by multiple functional blocks of one or more 3D ICs, a functional block of the multiple functional blocks can perform a first data processing function that includes a processing logic IC controlling storage and retrieval of data to and from first and second memory ICs. The functional block can also be changed on demand (such as by a CPU), so that the functional block is configured to perform a second data processing function. The functional block can also perform the second data processing function that includes the processing logic IC controlling storage and retrieval of data to and from the first and second memory ICs in a different way from the way the processing logic IC controls storage and retrieval of data to and from the first and second memory ICs during the first data processing function. In such an example method, each functional block of the multiple functional blocks includes a respective processing logic IC, a respective first memory IC, and a respective second memory IC, and the respective processing logic IC, the respective first memory IC, and respective the second memory IC are arranged in a first direction (e.g., vertically) as a stack of ICs to form the functional block.

At least some aspects of the present disclosure are directed to 3D SICs having functional blocks configured to provide redundancy sites. Also, in general, aspects of the present disclosure are directed to 3D ICs having functional blocks configured to provide redundancy sites or including layers or parts configured to provide redundancy sites.

Some embodiments disclosed herein can include a 3D SIC having stacked chips, wherein each chip can be partitioned into sections or partitions. A set of stacked partitions, which are columns of the 3D SIC, can be functional blocks of the 3D SIC. Each functional block can have independent functionality and each functional block can replace the functionality of another functional block. The 3D SIC can sense if a column is failing or about to fail and processing and/or storage provided by the failing or impending failing column can be re-routed to a different column of the 3D SIC upon sensing the column failure or the impending failure.

With reference to the drawings herein, it is to be understood that columns of the 3D SIC can be or include the functional blocks described herein. A column of the 3D SIC illustrated herein can be or include a respective functional block. It is also to be understood that in some embodiments a column of the columns of the 3D SIC can include additional features in addition to its respective functional block. In some other embodiments, a column of the 3D SIC is a functional block of the 3D SIC.

The 3D SIC can be self-monitoring and self-controlling. And, the rerouting can occur by simple sensors and switches integrated into the layers of the 3D SIC. Each layer can have a corresponding die, and the die can be partitioned such that each functional block has a respective partition of the die.

In general, embodiments can include a 3D SIC with one or more spare functional blocks that are reserved as substitutes and/or redundant sites for neighboring blocks. In some embodiments, blocks are spare blocks when the blocks are not included in an available address space for a usual operation of the 3D SIC.

The 3D SIC can be configured to replicate data stored in a first column of the plurality of columns to a second column of the plurality of columns, based at least in part on a threshold number of failed operations. An error detecting logic circuit in the 3D SIC can be configured to determine that the first column is failing, based at least in part on the threshold number of failed operations occurring within a predetermined period of time.

The 3D SIC can monitor the error rates of the actively used functional blocks (such as bit error rates). The active error rates in operating the memory components within layers of the 3D SIC can be used to predict the remaining life of the memory components. When an error rate of a memory component is above a threshold, the block can be determined as failing. A redundant site for the failing block can be automatically built on a nearby spare block for the failing block.

The function of the failing block can failover to the redundant site entirely or partially. For example, the spare block can be shared by multiple surrounding blocks for partial failover. For example, when one layer is failing at one block while other layers of the block are still functioning normally, the function and/or data in the layer of the failing block can be mirrored on a corresponding layer or an entirely different layer in the nearby spare block. Thus, the spare block functions can be used by a repair tool to provide spare parts to repair more than one surrounding block. Also, a partially failed block can be used to provide spare parts to the neighboring blocks. After a block has failed a certain number of times or has been selected for deactivation, its working parts can be delegated for healthier blocks. This can be after the block is retired systematically via software, or through failover of the dysfunctional block to the healthier block.

As illustrated herein, a 3D SIC can have at least non-volatile memory layers (such as 3DXP layers) that are partitioned into functional blocks (e.g., see the functional blocks of FIGS. 8-11). The 3D SIC can also be heterogenous and include different types of memory layers as well as at least one logic layer (e.g., see the functional blocks of FIGS. 1-5 and 8). The 3D SIC itself and/or a connected processor can discover if a column is failing or about to fail, and upon such a discovery can replicate the failing or impending failing column to another column of the 3D SIC. For example, the failing block can be replicated in a spare block via a backup process controlled within the 3D SIC itself by a logic layer and/or by an external device such as a processor connected to the 3D SIC via a bus. A component that is about to fail can be discovered by its error rate (such as by its bit error rate). For example, as its error rate increases above a threshold. Or, for example, failure can be discovered by a function retrying more than a threshold number of times to get an expected result.

Analogous functionality can be provided at the layer level within a functional block as well. For instance, if a first non-volatile memory layer in the functional block is failing or about to fail (such as by sensing the impeding failure by a simple integrated sensor and/or a logic circuit), the data and configuration of the first non-volatile memory layer can be replicated to a second non-volatile memory layer of the functional block or another functional block. Also, for example, if all the non-volatile memory layers of a first functional block are failing or about to fail, then the configurations and data of the non-volatile memory layers of the first block can be replicated on corresponding layers of a second functional block.

Neighboring functional blocks (e.g., the neighboring functional block 112 illustrated in FIGS. 1-5 and 8) of a failing or about to fail block (e.g., functional block 114) can be reserved to be spare blocks and then redundant blocks. In some embodiments, a block is reserved as a spare block in that the block is not included in an available address space for operations (e.g., usual operations) of the 3D SIC. The 3D SIC can monitor the error rates (such as bit error rates) of the actively used blocks. The active error rate in operating the memory layer of a block can be used to predict the remaining life of the memory layer. When the error rate is above a threshold, the block can be considered as failing or at least that layer in the block can be determined as failing. A redundant site can be automatically built on a nearby spare block or spare block layer for the failing block or layer, respectively. The function of the failing block can failover to the redundant site entirely or partially.

Also, a spare block can be shared by multiple surrounding blocks for partial failover for each block that needs support. For example, when one layer is failing at one neighboring block while other layers of the block are still functioning normally, the function and/or data in the layer of the failing block can be mirrored on the same layer (or a different layer) in the nearby spare block. This can be done between one spare block and neighboring blocks that need support. A repair tool can manage and provide the spare parts to repair more than one surrounding block. The tool can be part of the 3D SIC and/or part of an external device monitoring the 3D SIC. Also, a partially failed block can be used to provide spare parts to the neighboring blocks, e.g., after the partially failed block is retired systematically via software, or through failover to a healthy block.

Since the redundant site provides redundancy, the failing column can go down and fail over to the redundant site immediately, without impacting the functionally of 3D SIC. Similarly, when the error rate (such as a bit error rate) of the failing column is above a threshold, the failing column can be retired once the redundant site is functional. This can improve the performance of the 3D SIC.

In general, the failing column can have problems in memory and/or processing logic. Processing logic can have active and/or transitory data that can also be replicated to allow the processing logic to be replaced with minimized data lost and/or down time.

Also, when a first layer of a first functional block is failing, it can be replicated to a layer of a second functional block, such that re-routing can be used to replace the functionality of the failing layer of the first block with the layer of the second block and re-routing can be used when the failing layer of the first block is retired or dead. This allows the second block to repair multiple surrounding functional blocks until it runs out of spare parts or layers.

Figure 8:
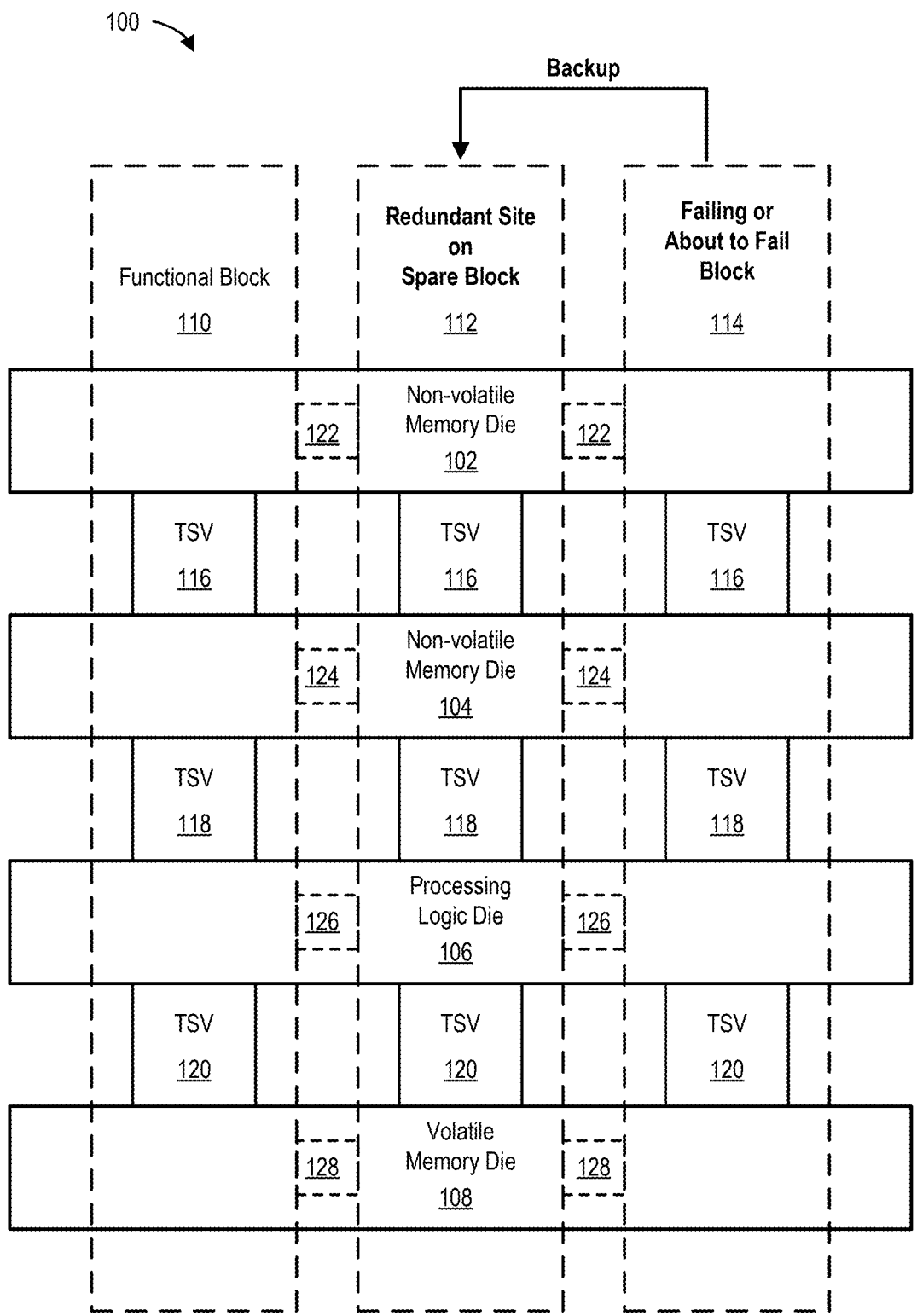
FIG. 8 illustrates a front view of the 3D SIC illustrated in FIGS. 1, 5, and 6 and a functional block of the 3D SIC configured to provide redundancy sites in accordance with some embodiments of the present disclosure.

FIG. 8 illustrates a front view of the 3D SIC 100 illustrated in FIGS. 1, 5, and 6 and a functional block 112 of the 3D SIC configured to provide redundancy sites in accordance with some embodiments of the present disclosure. As labeled in FIG. 8, functional block 114 is failing or about to fail, and is being replicated to be stored in functional block 112 such that block 112 is providing data redundancy sites for block 114.

Figure 9:
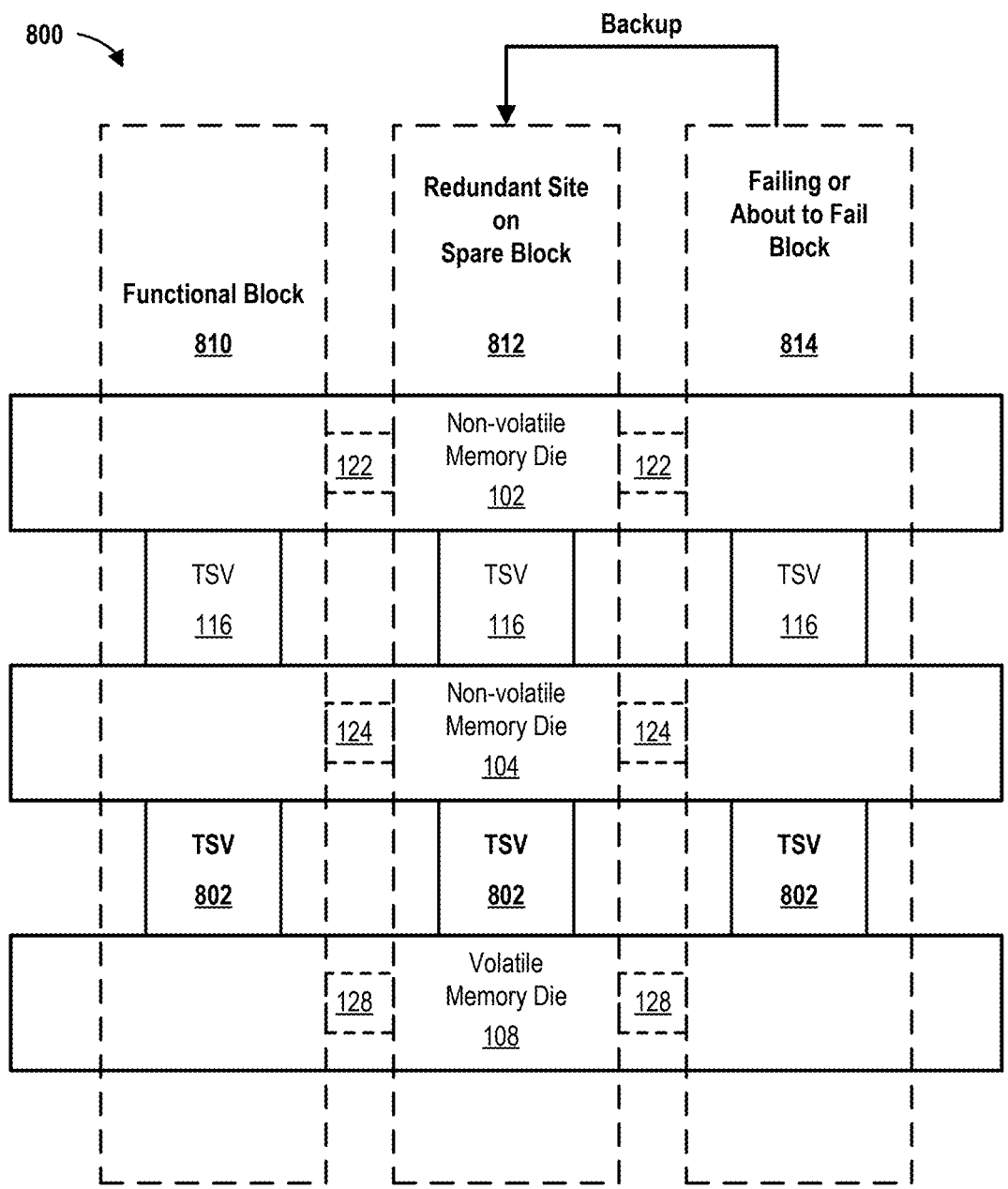
FIG. 9 illustrates a front view of an example 3D SIC having multiple non-volatile memory dies and a volatile memory die as well as a functional block configured to provide redundancy sites in accordance with some embodiments of the present disclosure.

FIG. 9 illustrates a front view of an example 3D SIC 800 having multiple non-volatile memory dies 102 and 104 and a volatile memory die 108 as well as a functional block 812 configured to provide redundancy sites in accordance with some embodiments of the present disclosure. 3D SIC 800 also has TSVs 802 in between the non-volatile memory die 104 and the volatile memory die 108. TSVs 802 and 116 are parts of single TSVs passing through the dies of the 3D SIC 800 wherein each of the single TSVs passing through the dies is perpendicular to the dies. For instance, TSVs 802 and 116 in functional block 810 are a single TSV passing through each die of 3D SIC 800. As labeled in FIG. 9, functional block 814 is failing or about to fail, and is being replicated to be stored in functional block 812 such that block 812 is providing data redundancy sites for block 814.

It is to be understood that parts that are numbered similarly between drawings can be similar in structure, composition, and function. For example, the memory dies in FIG. 9 are similar to the memory dies in FIGS. 1, 5 and 8. Also, TSVs 116 and interconnects 122, 124, and 128 illustrated in FIGS. 1, 5 and 8 are similar in structure, composition, and function to TSVs 116 and interconnects 122, 124, and 128 in FIG. 9.

Figure 10:
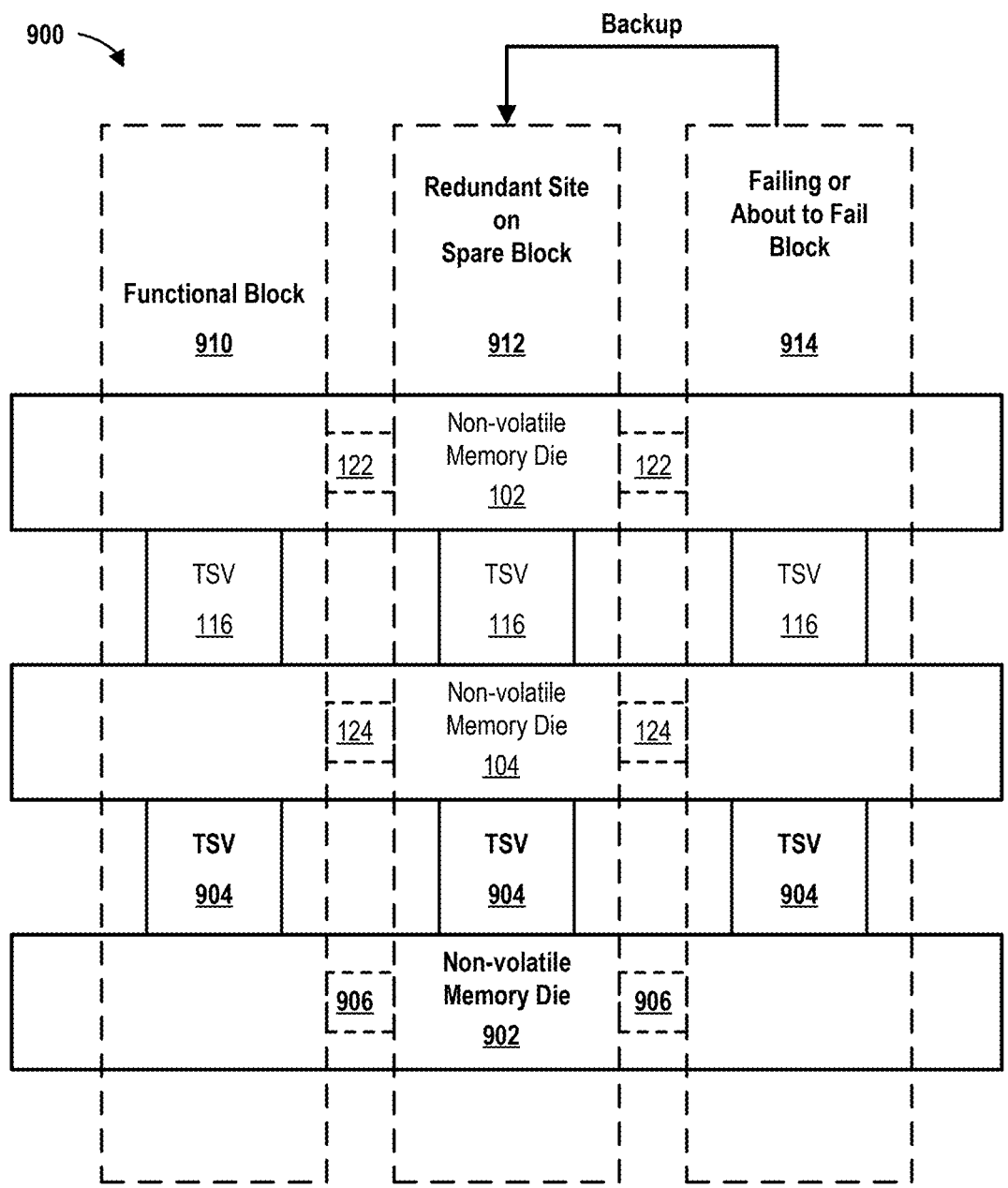
FIG. 10 illustrates a front view of an example 3D SIC having multiple non-volatile memory dies and a functional block configured to provide redundancy sites in accordance with some embodiments of the present disclosure.

FIG. 10 illustrates a front view of an example 3D SIC 900 having multiple non-volatile memory dies 102, 104, and 902 and a functional block 912 configured to provide redundancy sites in accordance with some embodiments of the present disclosure. 3D SIC 900 also has TSV 904 in between the non-volatile memory dies 104 and 902 as well as interconnects 906 in between partitions of the non-volatile memory die 902. TSVs 904 and 116 are parts of single TSVs passing through the dies of the 3D SIC 900 wherein each of the single TSVs passing through the dies are perpendicular to the dies. For instance, TSVs 904 and 116 in functional block 910 are a single TSV passing through each die of 3D SIC 900. As labeled in FIG. 10, functional block 914 is failing or about to fail, and is being replicated to be stored in functional block 912 such that block 912 is providing data redundancy sites for block 914.

It is to be understood that parts that are numbered similarly between drawings can be similar in structure, composition, and function. For example, the non-volatile memory dies in FIG. 10 are similar to the non-volatile memory dies in FIGS. 1, 5 and 8. Also, TSVs 116 and interconnects 122 and 124 illustrated in FIGS. 1, 5 and 8 are similar in structure, composition, and function to TSVs 116 and interconnects 122 and 124 in FIG. 10.

Figure 11:
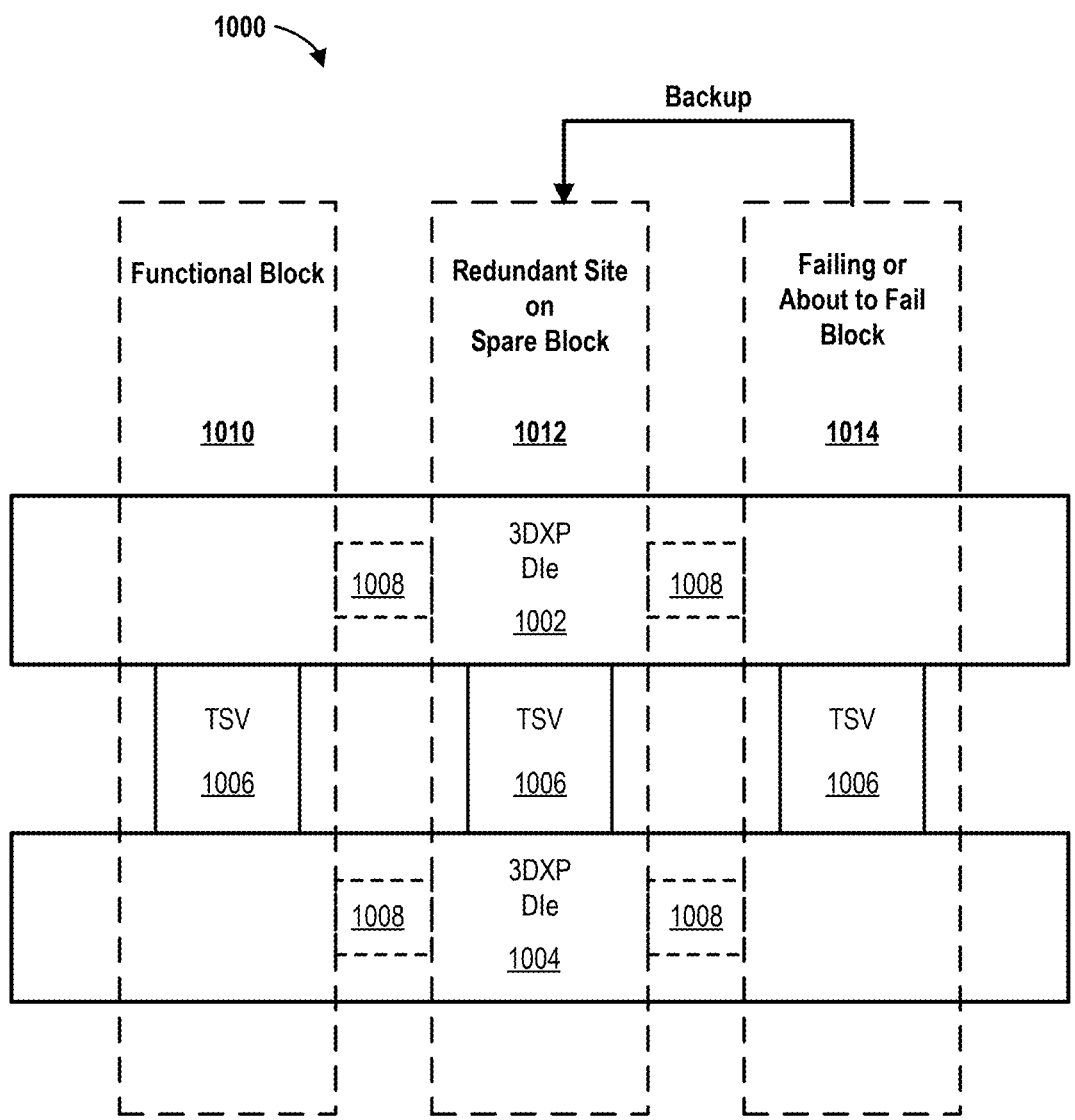
FIG. 11 illustrates a front view of an example 3D SIC having multiple 3DXP dies and a functional block configured to provide redundancy sites in accordance with some embodiments of the present disclosure.
Figure 13:
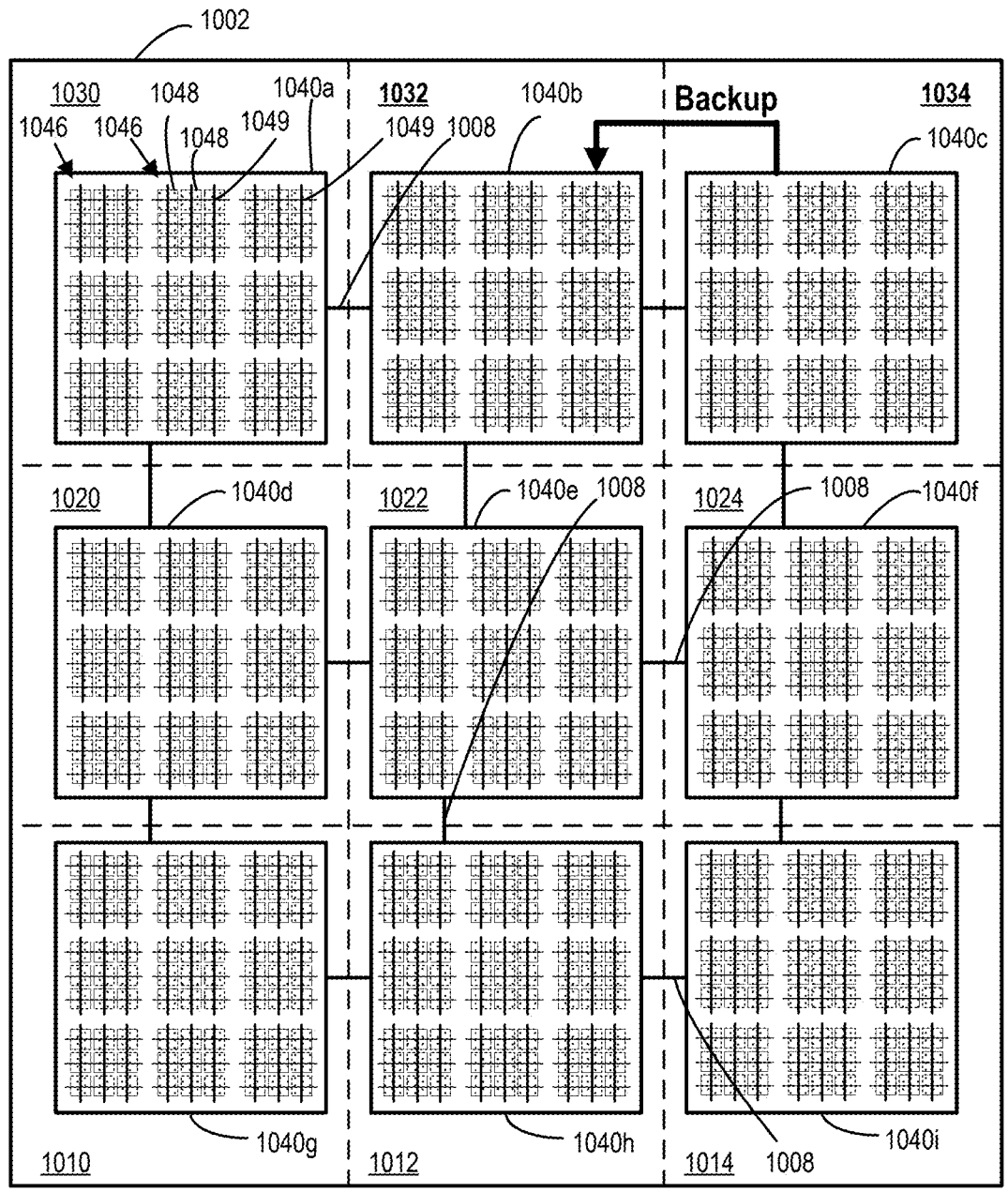
FIG. 13 illustrates a top view of an example 3DXP die having multiple 3DXP partitions and at least one partition configured to provide a redundancy site in accordance with some embodiments of the present disclosure.

FIG. 11 illustrates a front view of an example 3D SIC 1000 having 3DXP dies 1002 and 1004 and a functional block 1012 configured to provide redundancy sites in accordance with some embodiments of the present disclosure. 3D SIC 1000 also has TSVs 1006 in between the 3DXP dies 1002 and 1004 as well as interconnects 1008 in between the partitions of each of the 3DXP dies (e.g., see interconnects 1008 between 3DXP partitions 1040a, 1040b, 1040c, 1040d, 1040e, 1040f, 1040g, 1040h, and 1040i illustrated in FIG. 13). TSVs 1006 pass through the dies of the 3D SIC 1000 wherein each of the single TSVs passing through the dies are perpendicular to the dies. As labeled in FIG. 11, functional block 1014 is failing or about to fail, and is being replicated to be stored in functional block 1012 such that block 1012 is providing data redundancy sites for block 1014. Each of the functional blocks 1010, 1012, and 1014 illustrated in FIG. 11 are shown having parts of 3DXP dies 1002 and 1004. It is also shown that each of the functional blocks 1010, 1012, and 1014 have a respective TSV of TSVs 1006. And, each of the dies 1002 and 1004 are shown having respective interconnects 1008 connecting the partitions of each die. As depicted, the functional blocks (also referred to herein as columns) are perpendicular to the 3DXP dies.

Figure 12:
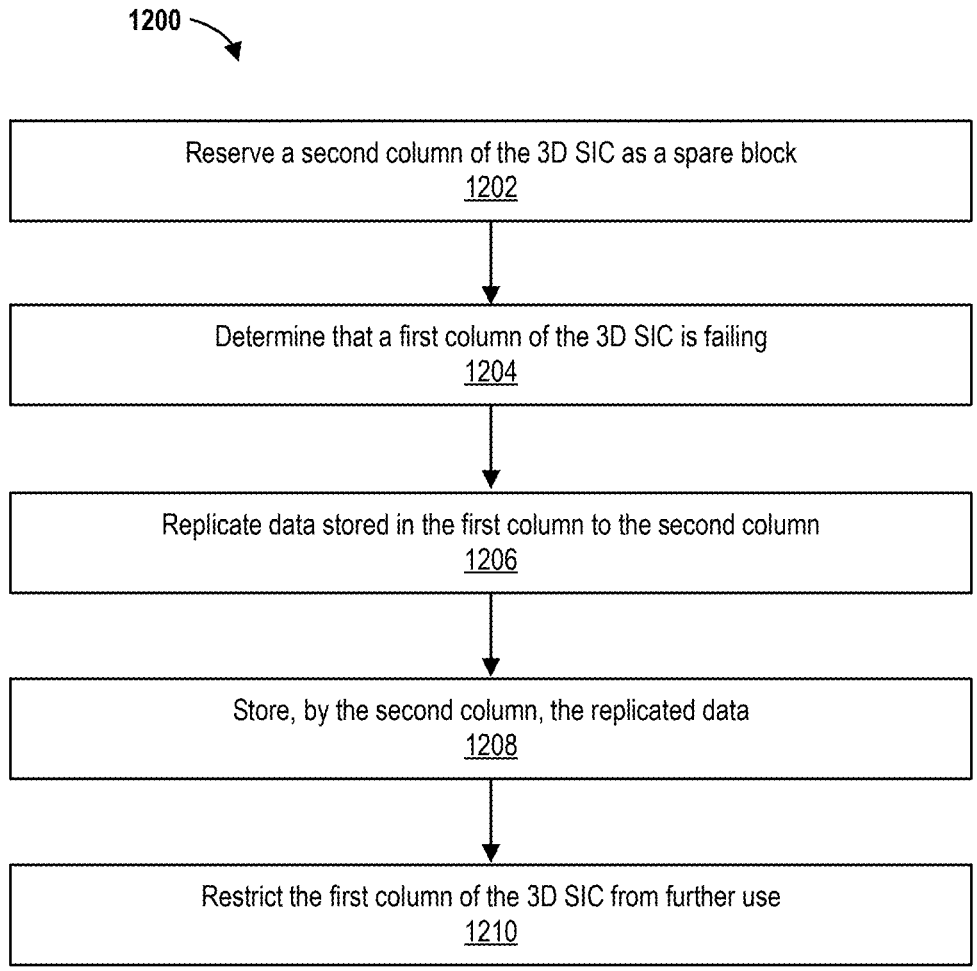
FIG. 12 illustrates a flow diagram of an example method for replicating data from one column of a 3D SIC to another column in accordance with some embodiments of the present disclosure.
Figure 14:
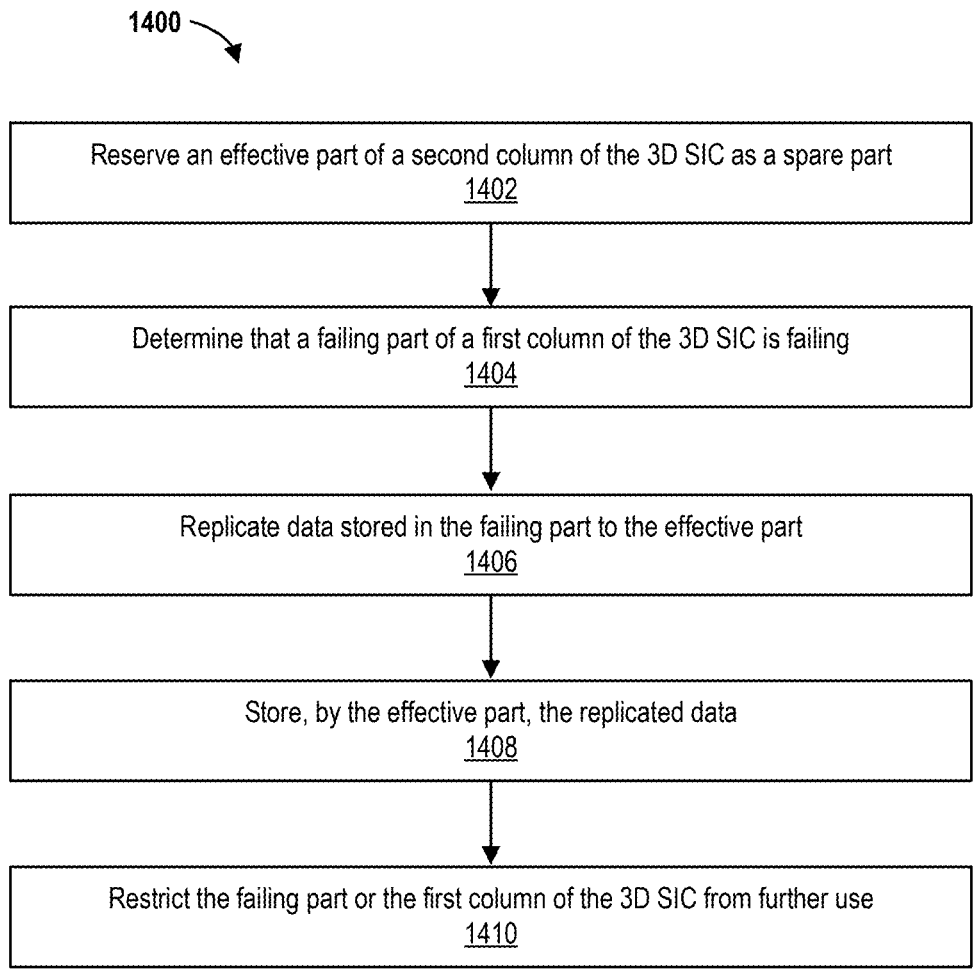
FIG. 14 illustrates a flow diagram of an example method for replicating data from one part of a column of a 3D SIC to a corresponding part of another column in accordance with some embodiments of the present disclosure.
Figure 15:
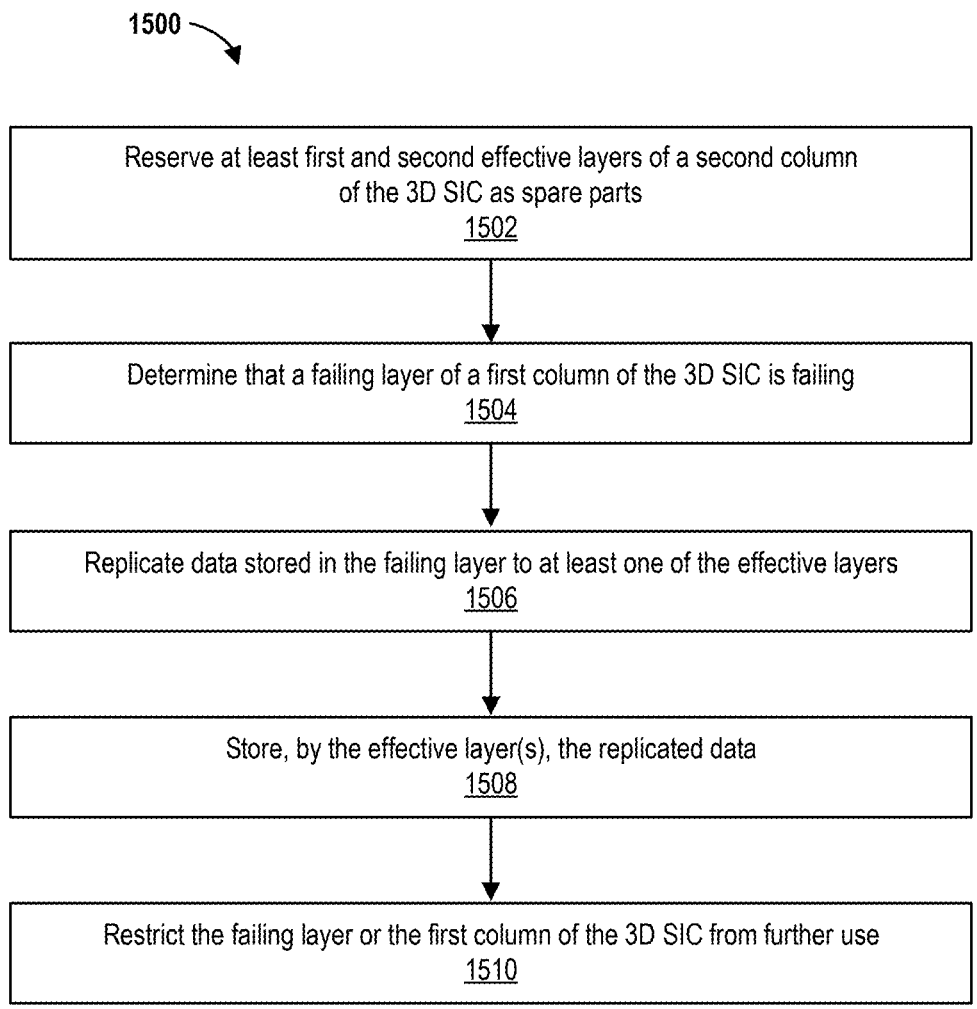
FIG. 15 illustrates a flow diagram of an example method for replicating data from one layer of a column of a 3D SIC to one or more layers of another column in accordance with some embodiments of the present disclosure.

FIG. 12 illustrates a flow diagram of an example method 1200 for replicating data from one column of a 3D SIC to another column in accordance with some embodiments of the present disclosure. FIG. 14 illustrates a flow diagram of an example method 1400 for replicating data from one part of a column of a 3D SIC to a corresponding part of another column in accordance with some embodiments of the present disclosure. FIG. 15 illustrates a flow diagram of an example method 1500 for replicating data from one layer of a column of a 3D SIC to one or more layers of another column in accordance with some embodiments of the present disclosure.

Any one of the methods 1200, 1400, and 1500, in general, can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order and performed by particular hardware/software, unless otherwise specified, the order and hardware/software of the processes can be modified. Thus, the illustrated embodiments should be understood only as examples, and the illustrated processes can be performed in a different order and/or by different hardware/software, and some processes can be performed in parallel. Additionally, one or more processes can be omitted in various embodiments. Thus, not all processes are required in every embodiment. Other process flows are possible as well.

Any one of the methods 1200, 1400, and 1500 can be implemented by a 3D SIC alone (e.g., see 3D SIC 100, 800, 900, or 1000), or by a 3D SIC operating with a controller connected to the 3D SIC via a bus (e.g., see 3D SIC 100, bus 604, and controller 606 as depicted in FIG. 6). Any one of the methods 1200, 1400, and 1500 can be implemented by a 3D SIC having one or more non-volatile memory dies (e.g., see 3D SIC 900 or 1000). For instance, anyone of the methods can be implemented by a 3D SIC having multiple 3DXP dies (e.g., see 3D SIC 1000). Anyone of the methods can also be implemented by a 3D SIC having heterogeneous layers, such as a 3D SIC having at least one or more non-volatile memory dies and one or more volatile memory dies (e.g., see 3D SIC 800). Anyone of the methods can also be implemented by a 3D SIC having memory dies and at least one processing logic die (e.g., see 3D SIC 100).

As shown in FIG. 12, the method 1200 begins at operation 1202 with a second column of the 3D SIC being reserved as a spare column. At operation 1204, it is determined that a first column of the 3D SIC is failing. At operation 1206, data stored in the first column is replicated to the second column of the 3D SIC. At operation 1208, the replicated data is stored by the second column of the 3D SIC. At operation 1210, the first column of the 3D SIC is restricted from further use. Each of these operations can be performed by different elements of the 3D SIC. And, any one of the 3D SICs described herein can perform each operation of method 1200. However, for the sake of brevity, 3D SIC 1000 is mostly used as an example below of a 3D SIC implementing the operations of method 1200.

In the 3D SIC 1000 shown in FIG. 11, depicted is a 3D SIC having a first 3DXP die 1002 and a second 3DXP die 1004. The first 3DXP die 1002 and the second 3DXP die 1004 are stacked and the 3D SIC is partitioned into a plurality of columns that are perpendicular to each of the stacked dies (e.g., see the functional blocks 1010, 1012, and 1014).

The 3D SIC 1000 can be configured to replicate data stored in a first column (e.g., functional block 1014) of the plurality of columns to a second column (e.g., functional block 1012) of the plurality of columns, in response to a determination that the first column is failing. For example, the 3D SIC 1000 can be configured to replicate data stored in a first column of the plurality of columns to a second column of the plurality of columns, based at least in part on a threshold number of failed operations. Also, the 3D SIC 1000 can be configured to replicate data stored in a first column of the plurality of columns to a second column of the plurality of columns, based at least in part on the threshold number of failed operations occurring within a predetermined period of time.

The first column and the second column can be neighboring columns (e.g., see neighboring blocks 1012 and 1014) in that no column of the plurality of columns is positioned between the first and the second columns. Thus, the 3D SIC 1000 (as well as 3D SIC 100, 800, or 900) can be configured to perform operation 1206. And, the second column can be configured to store the data as a redundant site of the data. Thus, the second column of the 3D SIC can be configured to perform operation 1208.

An error detecting logic circuit in the 3D SIC (not depicted in the drawings) can be configured to determine that the first column is failing, in response to an error rate (e.g., a bit error rate) at the first column increasing above a threshold. Also, the error detecting logic circuit in the 3D SIC can be configured to determine that the first column is failing, in response to re-use of the first column occurring over a threshold number of times to receive an expected result. Thus, the error detecting logic circuit can be configured to perform operation 1204.

In some embodiments, a logic layer or logic die of the 3D SIC (e.g., see processing logic die 106 of 3D SIC 100) can include the error detecting logic circuit. In some embodiments, an error detecting logic circuit can be included on a memory die. In some embodiments, the error detecting logic circuit can be external to the 3D SIC or at least external to one of the dies but packaged within the 3D SIC.

The second column of the 3D SIC 1000 (as well as the second column of any one of the 3D SICs described herein) can be a spare column in that it is reserved for storing a replication of data from another column that is failing. Also, the second column can be a spare column in that it is reserved for storing replications of data from multiple columns that are failing. The spare column can be restricted from regular use by the 3D SIC 1000 such as by not being included in an available address space for operations of the 3D SIC. In such an example, the spare column can be used only for storing a replication of data from another column that is failing. The 3D SIC 1000 (as well as any one of the 3D SICs described herein) can be configured to select the second column to become the redundant site of the data. Thus, in general, the 3D SIC can be configured to perform operation 1202. Also, in some embodiments, a logic die of the 3D SIC (such as processing logic die 106) can be configured to select the second column to become the redundant site of the data. Thus, the logic die can be configured to perform operation 1202. The 3D SIC can also include a port (such as communication interface 602 illustrated in FIG. 6), configured to receive instructions from an external device that is connected to the 3D SIC by a bus (such as controller 606 which is connected to 3D SIC 100 via bus 604). The instructions can be executable by the 3D SIC to select the second column of the 3D SIC to become the redundant site of the data. Thus, an external device via the communicated instructions can be configured to perform operation 1202.

An error prevention logic circuit in the 3D SIC 1000 (as well as any other of the 3D SICs described herein) can be configured to restrict the first column from further use, in response to the determination that the first column is failing and the completion of the replication of the data to the second column. Thus, the error prevention logic circuit can be configured to perform operation 1210.

In some embodiments, the error prevention logic circuit can be a part of the logic die. In some embodiments, an error prevention logic circuit can be included on a memory die. In some embodiments, the error prevention logic circuit can be external to the 3D SIC or at least external to one of the dies but packaged within the 3D SIC.

FIG. 13 illustrates a top view of an example 3DXP die 1002 having multiple 3DXP partitions (each partition having multiple non-volatile memory elements) and at least one partition configured to provide a redundancy site in accordance with some embodiments of the present disclosure. As shown in FIG. 13, 3DXP partition 1040*b* of functional block 1032 is configured to provide a redundancy site for the data stored in 3DXP partition 1040*c* of functional block 1034. Also depicted in FIG. 13, the 3DXP die 1002 is shown including functional blocks 1010, 1012, 1014, 1020, 1022, 1024, 1030, 1032, and 1034. As illustrated, each of the functional blocks includes a respective 3DXP partition, e.g., 3DXP partition 1040*a*, 1040*b*, 1040*c*, 1040*d*, 1040*e*, 1040*f*, 1040*g*, or 1040*h*. Also, FIG. 13 depicts 3DXP clusters 1046 of 3DXP memory elements 1048. Each memory element 1048 includes a 3DXP cross point 1049. Also, FIG. 13 shows the interconnects 1008 connecting the partitions of the die 1002.

As shown in FIG. 14, the method 1400 begins at operation 1402 with an effective part of a second column of the 3D SIC being reserved as a spare part. At operation 1404, it is determined that a failing part of a first column of the 3D SIC is failing. At operation 1406, data stored in the failing part of the first column is replicated to the effective part of the second column of the 3D SIC. At operation 1408, the replicated data is stored by the effective part of the second column of the 3D SIC. At operation 1410, the first column or the failing part of the first column is restricted from further use. Each of these operations can be performed by different elements of the 3D SIC. And, any one of the 3D SICs described herein can perform each operation of method 1400. However, for the sake of brevity, 3D SIC 1000 is mostly used as an example below of a 3D SIC implementing the operations of method 1400.

The 3D SIC 1000 can be configured to replicate data stored in a failing part of a first column (e.g., failing 3DXP partition 1040*c*) of the plurality of columns to an effective part of a second column (e.g., effective 3DXP partition 1040*b*) of the plurality of columns, in response to a determination that the failing part of the first column is failing. The failing part of the first column and the effective part of the second column can be in neighboring partitions of the same die in that no partition on the same die is positioned between the neighboring partitions. Also, the first column and the second column can be neighboring columns in that no column of the plurality of columns is positioned between the first and the second columns. Thus, the 3D SIC 1000 (as well as 3D SIC 100, 800, or 900) can be configured to perform operation 1406. And, the effective part of the second column can be configured to store the data as a redundant site of the data. Thus, the effective part of the second column of the 3D SIC can be configured to perform operation 1408.

In some embodiments, the 3D SIC can be configured to replicate at least one of data and processing logic in the failing part to the effective part, in response to a determination that the failing part is failing. The effective part can be configured to store the at least one of data and processing logic as a redundant site of the at least one of data and processing logic. And, the failing part can be in a first partition of the logic die in the first column and the effective part can be in a second partition of the logic die in the second column.

An error detecting logic circuit in the 3D SIC (not depicted in the drawings) can be configured to determine that the failing part of the first column is failing, in response to an error rate (e.g., a bit error rate) at the failing part increasing above a threshold. Also, the error detecting logic circuit in the 3D SIC can be configured to determine that the failing part is failing, in response to re-use of the failing part occurring over a threshold number of times to receive an expected result. Thus, the error detecting logic circuit can be configured to perform operation 1404.

The effective part of the second column of the 3D SIC 1000 (as well as the effective part of the second column of any one of the 3D SICs described herein) can be a spare part in that it is reserved for replication of data from a corresponding part of another column that is failing. Also, the second column can include a second spare part that is reserved for replication of data from a corresponding part of a second other column that is failing. The 3D SIC 1000 (as well as any one of the 3D SICs described herein) can be configured to select the effective part of the second column to become the redundant site of the data. Thus, in general, the 3D SIC can be configured to perform operation 1402. Also, in some embodiments, a logic die of the 3D SIC (such as processing logic die 106) can be configured to select the effective part of the second column to become the redundant site of the data. Thus, the logic die can be configured to perform operation 1402. The 3D SIC can also include a port (such as communication interface 602), configured to receive instructions from an external device that is connected to the 3D SIC by a bus (such as controller 606 which is connected to 3D SIC 100 via bus 604). The instructions can be executable by the 3D SIC to select the effective part of the second column of the 3D SIC to become the redundant site of the data. Thus, an external device via the communicated instructions can be configured to perform operation 1402.

An error prevention logic circuit in the 3D SIC 1000 (as well as any other of the 3D SICs described herein) can be configured to restrict the failing part or the first column from further use, in response to the determination that the failing part of the first column is failing and the completion of the replication of the data to the effective part of the second column. Thus, the error prevention logic circuit can be configured to perform operation 1410.

As shown in FIG. 15, the method 1500 begins at operation 1502 with first and second layers of a second column of the 3D SIC being reserved as spare parts. At operation 1504, it is determined that a failing layer of a first column of the 3D SIC is failing. At operation 1506, data stored in the failing layer of the first column is replicated to at least one of the effective layers of the second column of the 3D SIC. At operation 1508, the replicated data is stored by the effective layer of the second column of the 3D SIC. At operation 1510, the first column or the failing layer of the first column is restricted from further use. Each of these operations can be performed by different elements of the 3D SIC. And, any one of the 3D SICs described herein can perform each operation of method 1500. However, for the sake of brevity, 3D SIC 1000 is mostly used as an example below of a 3D SIC implementing the operations of method 1500.

As shown in FIG. 11, the first 3DXP die 1002 is directly stacked onto the second 3DXP die 1004 without any die stacked between the first and the second 3DXP dies. The 3D SIC 1000 is partitioned into a plurality of columns that are perpendicular to each of the stacked dies. And, each column of the plurality of columns includes a respective partition of the first 3DXP die, which is a first layer of the column, and a respective partition of the second 3DXP die, which is a second layer of the column.

The 3D SIC 1000 can be configured to replicate data stored in the first layer of a first column to at least one of the first layer and the second layer of a second column, in response to a determination that the first layer of the first column is failing. The failing layer of the first column and the effective layer(s) of the second column can be in neighboring partitions of neighboring columns in that no column is positioned between the neighboring columns. Thus, the 3D SIC 1000 (as well as 3D SIC 100, 800, or 900) can be configured to perform operation 1506. And, the effective layer(s) of the second column can be configured to store the data as a redundant site of the data. Thus, the effective layer(s) of the second column of the 3D SIC can be configured to perform operation 1508.

An error detecting logic circuit in the 3D SIC (not depicted in the drawings) can be configured to determine that the failing layer of the first column is failing, in response to an error rate (e.g., a bit error rate) at the failing layer increasing above a threshold. Also, the error detecting logic circuit in the 3D SIC can be configured to determine that the failing layer is failing, in response to re-use of the failing layer occurring over a threshold number of times to receive an expected result. Thus, the error detecting logic circuit can be configured to perform operation 1504.

The effective layers of the second column of the 3D SIC 1000 (as well as the effective layers of the second column of any one of the 3D SICs described herein) can be spare layers in that they are reserved for replication of data from corresponding layers of other columns that are failing. The 3D SIC 1000 (as well as any one of the 3D SICs described herein) can be configured to select the effective layer(s) of the second column to become the redundant site of the data. Thus, in general, the 3D SIC can be configured to perform operation 1502. Also, in some embodiments, a logic die of the 3D SIC (such as processing logic die 106) can be configured to select the effective layer(s) of the second column to become the redundant site of the data. Thus, the logic die can be configured to perform operation 1502. The 3D SIC can also include a port (such as communication interface 602), configured to receive instructions from an external device that is connected to the 3D SIC by a bus (such as controller 606 which is connected to 3D SIC 100 via the bus 604). The instructions can be executable by the 3D SIC to select the effective layer(s) of the second column of the 3D SIC to become the redundant site of the data. Thus, an external device via the communicated instructions can be configured to perform operation 1502.

An error prevention logic circuit in the 3D SIC 1000 (as well as any other of the 3D SICs described herein) can be configured to restrict the failing layer or the first column from further use, in response to the determination that the failing layer of the first column is failing and the completion of the replication of the data to the effective layer(s) of the second column. Thus, the error prevention logic circuit can be configured to perform operation 1510.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An integrated circuit comprising:
a plurality of functional blocks of memory and a logic circuit configured to perform a task using the functional blocks of memory;
wherein the integrated circuit is configured to identify, among the functional blocks, a first functional block and set up a second functional block to perform a task.

2. The circuit of claim 1, wherein the first functional block and the second functional block are neighboring in that no block of the plurality of functional blocks is positioned between the first and the second functional blocks.

3. The circuit of claim 1, wherein the task is a redundant task to be performed comprises replicating data stored in the first block of the plurality of functional blocks to the second block of the plurality of functional blocks.

4. The circuit of claim 3, wherein an error detecting logic circuit in the circuit is configured to determine that the first functional block is failing, in response to re-use of the first functional block occurring over a threshold number of times to receive an expected result or in response to a bit error rate at the first functional block increasing above a threshold.

5. The circuit of claim 3, wherein the circuit is configured to select the second functional block to become the redundant site of the data.

6. The circuit of claim 3, further comprising a logic die, and wherein the logic die is configured to select the second functional block to become the redundant site of the data.

7. The circuit of claim 3, further comprising a port configured to receive instructions from an external device that is connected to the circuit by a bus, wherein the instructions are configured to select the second functional block to become the redundant site of the data.

8. The circuit of claim 3, wherein an error prevention logic circuit in the circuit is configured to restrict the first functional block from further use, in response to the determination that the first functional block is failing and the completion of the replication of the data to the second functional block.

9. The circuit of claim 1, wherein the second functional block is a spare functional block in that it is reserved for storing a replication of data from another functional block that is failing and is restricted from regular use by the circuit by not being included in an available address space for operations of the circuit.

10. The circuit of claim 1, wherein the task is a redundant task to be performed comprises replicating data stored in the first block of the plurality of functional blocks to the second block of the plurality of functional blocks, based at least in part on a threshold number of failed operations.

11. A circuit, comprising:
a first functional block of memory; and
a second functional block of memory, wherein the circuit is configured to perform a task in the second functional block.

12. The circuit of claim 11, wherein the task is a redundant task to be performed comprises replicating data stored in a failing part of the first block to the second functional block, wherein a failing part of the first functional block and an effective part of the second functional block are in neighboring blocks of a same die in that no blocks on the same die is positioned between the neighboring blocks.

13. The circuit of claim 12, further comprising a logic die, and wherein the logic die is configured to select an effective part of the second functional block to become the redundant site of the data.

14. The circuit of claim 12, further comprising a port configured to receive instructions from an external device that is connected to the circuit by a bus, wherein the instructions are executable by the circuit to select the effective part of the second functional block to become the redundant site of the data.

15. The circuit of claim 12, further comprising a logic die, wherein the circuit is configured to replicate at least one of data and processing logic in a failing part to an effective part,
wherein the effective part is configured to store the at least one of data and processing logic as a redundant site of the at least one of data and processing logic, and
wherein the failing part is in a first section of the logic die in the first functional block and the effective part is in a second section of the logic die in the second functional block.

16. The circuit of claim 11, wherein the task is a redundant task to be performed comprises replicating data stored in a failing part of the first block to the second block, wherein a determination that the failing part is failing is based at least in part on a threshold number of failed operations occurring.

17. The circuit of claim 11, wherein the task is a redundant task to be performed comprises replicating data stored in a failing part of the first functional block to the second functional block, wherein an error detecting logic circuit in the circuit is configured to determine that the failing part is failing, in response to re-use of the failing part occurring over a threshold number of times to receive an expected result or in response to a bit error rate at the failing part increasing above a threshold.

18. The circuit of claim 11, wherein the task is a redundant task to be performed comprises replicating data stored in a failing part of the first functional block to an effective part of the second functional block, wherein the effective part of the second functional block is a spare part in that it is reserved for replication of data from a corresponding part of another column that is failing and is restricted from regular use by the circuit by not being included in an available address space for operations of the circuit.

19. The circuit of claim 18, wherein the second functional block comprises a second spare part that is reserved for replication of data from a corresponding part of a second other functional block that is failing.

20. A circuit, comprising:
a first functional block of memory; and
a second functional block of memory,
wherein the circuit is configured to replicate data stored in the first functional block to the second functional block, and
wherein the second functional block is configured to store the data.

* * * * *